(12) United States Patent
Lee et al.

(10) Patent No.: US 10,665,805 B2
(45) Date of Patent: May 26, 2020

(54) LIGHT-EMITTING DIODE AND LIGHT-EMITTING DEVICE INCLUDING THE SAME

(71) Applicant: LG Display Co., Ltd., Seoul (KR)

(72) Inventors: Seung-Jae Lee, Paju-si (KR); Jong-Kwan Bin, Paju-si (KR); Na-Yeon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/140,784

(22) Filed: Sep. 25, 2018

(65) Prior Publication Data
US 2019/0097151 A1 Mar. 28, 2019

(30) Foreign Application Priority Data

Sep. 26, 2017 (KR) ........................ 10-2017-0124553

(51) Int. Cl.
| | |
|---|---|
| *H01L 51/50* | (2006.01) |
| *H01L 51/52* | (2006.01) |
| *H01L 51/56* | (2006.01) |
| *H01L 27/32* | (2006.01) |

(52) U.S. Cl.
CPC ........ *H01L 51/5004* (2013.01); *H01L 51/502* (2013.01); *H01L 51/5056* (2013.01); *H01L 51/5072* (2013.01); *H01L 51/5076* (2013.01); *H01L 51/5084* (2013.01); *H01L 51/5092* (2013.01); *H01L 51/5206* (2013.01); *H01L 51/5221* (2013.01); *H01L 51/56* (2013.01); *H01L 27/3244* (2013.01); *H01L 2251/5353* (2013.01); *H01L 2251/5369* (2013.01)

(58) Field of Classification Search
CPC ............. H01L 51/5004; H01L 51/5084; H01L 51/5076; H01L 51/5072; H01L 51/56; H01L 51/502; H01L 51/5056; H01L 51/5092; H01L 51/5221; H01L 51/5206; H01L 51/5203; H01L 27/3244; H01L 33/38; H01L 33/20
USPC ........ 257/40, 13, 98, 99, E51.019, E33.062; 313/311, 491, 504
See application file for complete search history.

(56) References Cited

U.S. PATENT DOCUMENTS

| | | | | |
|---|---|---|---|---|
| 8,487,521 | B2 * | 7/2013 | Hirakawa | ............... H01J 63/06 |
| | | | | 313/311 |
| 8,559,852 | B2 * | 10/2013 | Hirakawa | ................ G09G 3/22 |
| | | | | 313/497 |
| 10,396,306 | B2 * | 8/2019 | Kim | ...................... G09G 3/3208 |
| 2011/0045392 | A1 * | 2/2011 | Lemmer | ............. H01L 51/5048 |
| | | | | 430/56 |

(Continued)

*Primary Examiner* — Dao H Nguyen
(74) *Attorney, Agent, or Firm* — Fenwick & West LLP

(57) ABSTRACT

A light emitting diode includes a first electrode and a second electrode facing the first electrode. The light emitting diode further includes an emitting material layer (EML) disposed between the first electrode and the second electrode, and an electron transport layer (ETL) adjacent the EML. The ETL includes a plurality of first inorganic particles having a first average particle size, and a plurality of second inorganic particles having a second average particle size greater than the first average particle size. The plurality of first inorganic particles may also have a first energy bandgap, and a plurality of second inorganic particles may also have a second energy bandgap smaller than the first energy bandgap.

20 Claims, 9 Drawing Sheets

(56) References Cited

U.S. PATENT DOCUMENTS

2015/0228850 A1* 8/2015 Zheng .................. H01L 51/502
                                                                257/13
2019/0081262 A1* 3/2019 Kim ..................... H01L 51/502

* cited by examiner

Prior Art

LIGHT-EMITTING DIODE AND LIGHT-EMITTING DEVICE INCLUDING THE SAME

CROSS-REFERENCE TO RELATED APPLICATIONS

This application claims the benefit under 35 U.S.C. § 119(a) of Republic of Korea Patent Application No. 10-2017-0124553, filed in Republic of Korea on Sep. 26, 2017, which is incorporated herein by reference in its entirety.

BACKGROUND

Related Field

The present disclosure relates to a light-emitting diode, and more specifically, to a light-emitting diode having improved luminous efficiency, and a light-emitting device including the same.

Discussion of the Related Art

With the advancement of electronic engineering and information technology, technology of the display field for processing and displaying a massive amount of information has also been rapidly developed. Accordingly, various flat panel display devices replacing the conventional cathode ray tube (CRT) have been developed. Among flat panel display devices, since an organic light-emitting diode (OLED) display device and a quantum dot light-emitting diode (QLED) display device may be formed in a thin structure and have low power consumption, the OLED display device and the QLED display device are used as a next-generation display device which replaces a liquid crystal display (LCD).

An OLED is a device in which, when electric charges are injected into an organic emissive layer formed between an electron injection electrode (cathode) and a hole injection electrode (anode), electrons and holes are paired and recombined to emit light. Not only may the OLED be formed even on a flexible transparent substrate such as a plastic substrate, but also it is possible to be operated even at a low voltage of 10 V or less. Power consumption of the OLED is relatively low, and color purity thereof is high.

FIG. 1 is a schematic diagram illustrating bandgap energies of electrodes constituting a conventional OLED and materials constituting a conventional emissive layer. Referring to FIG. 1, the OLED includes an anode and a cathode, which face each other, an emitting material layer EML disposed between the anode and the cathode, a hole injection layer HIL and a hole transport layer HTL, which are disposed between the anode and the emitting material layer EML, and an electron transport layer ETL disposed between the cathode and the emitting material layer EML.

An OLED is a device in which, when electric charges are injected into an organic emissive layer formed between an electron injection electrode Cathode and a hole injection electrode Anode, electrons and holes are paired and then recombined to emit light. The emitting material layer EML is made of a light-emitting material. Holes injected into the anode and electrons injected into the cathode meet in the emitting material layer EML to form excitons. The light-emitting material included in the emitting material layer EML becomes an excited state due to such energy, and energy of an organic compound transitions from an excited state to a ground state, thereby converting generated energy to emit light.

Meanwhile, the hole transport layer HTL and the hole injection layer HIL transport and inject positive charge carriers, i.e., holes into the emitting material layer EML from the anode, and the electron transport layer ETL transports and injects negative charge carriers, i.e., electrons into the emitting material layer EML from the cathode. In order to transport and inject holes and electrons into the emitting material layer EML, each of the layers should be made of a material with appropriate bandgap energy. In an example, the hole injection layer HIL may be made of poly(3,4-ethylenedioxythiophene) polystyrene sulfonate (PEDOT:PSS), and the hole transport layer HTL may be made of poly(4-butylphenyl-diphenyl-amine) (poly-TPD). The electron transport layer ETL may be made of an oxadiazole-based, triazole-based, benzoxazole-based, benzothiazole-based, benzimidazole-based or triazine-based organic compound, and for example, may be made of 2-biphenyl-4-yl-5-(4-t-butylphenyl)-1,3,4-oxadiazole (PBD).

However, when an organic compound is used as a material of the electron transport layer ETL, a difference $\Delta G_H$ between a highest occupied molecular orbital (HOMO) energy level of a light-emitting material, which is used in the emitting material layer EML, and a HOMO energy level of the organic material, which is used as the material of the electron transport layer ETL, is not great. As described above, due to the relatively high HOMO energy level of the organic material used in the electron transport layer ETL, the difference $\Delta G_H$ between the HOMO of the electron transport layer ETL and the HOMO energy level of the emitting material layer EML is small. Thus, some of the holes injected into the emitting material layer EML are leaked into the electron transport layer ETL. Such a problem is more serious in a QLED display device having a very deep HOMO energy level.

As some of the holes injected into the emitting material layer EML do not form excitons and are leaked into the electron transport layer ETL, the number of holes, which do not contribute to emission, is increased. Accordingly, luminous efficiency of an LED is decreased, and quantum efficiency thereof is decreased. In addition, since a high voltage should be applied to the LED in order to realize light emission, a driving voltage of the LED rises.

SUMMARY

Accordingly, the present disclosure is directed to a light-emitting diode and a light-emitting device including the same that obviate one or more of the problems due to the limitations and disadvantages of the related art.

An object of the present disclosure is to provide a light-emitting diode in which hole leakage and current leakage are not generated in an emissive layer and electric charges are injected into an emitting material layer in a balanced manner, and a light-emitting device including the light-emitting diode.

Another object of the present disclosure is to provide a light-emitting diode having improved emission properties such as luminous efficiency and quantum efficiency, and a light-emitting device including the light-emitting diode.

According to an aspect of the present disclosure, the present disclosure provides a light-emitting diode including: first and second electrodes facing each other; and an emissive layer between the first electrode and the second electrode and including an electron transfer layer of inorganic particles, wherein the inorganic particles include first inorganic particles having a first average particle size and second inorganic particles having a second average particle size greater than the first average particle size.

The inorganic particles may include oxide particles. The oxide particles may be selected from the group consisting of ZnO, ZnMgO$_2$, TiO$_2$, ZrO$_2$, SnO$_2$, WO$_3$, Ta$_2$O$_3$, HfO$_3$, Al$_2$O$_3$, ZrSiO$_4$, BaTiO$_3$, BaZrO$_3$, and combinations thereof.

The first average particle size may be in a range of 50% to 85% of the second average particle size.

The first inorganic particles and the second inorganic particles may be mixed at a weight ratio of 1:4 to 4:1 in the electron transfer layer. A content of the first inorganic particles may be greater than or equal to a content of the second inorganic particles in the electron transfer layer.

The first average particle size may be in a range of about 3.0 nm to about 5.5 nm, and the second average particle size may be in a range of about 6.0 nm to about 7.0 nm.

The emissive layer may further include an emitting material layer disposed between the first electrode and the electron transfer layer or between the second electrode and the electron transfer layer.

The emitting material layer may be made of inorganic luminescent particles or an organic light-emitting material.

The emissive layer may further include a hole transfer layer between the first electrode and the emitting material layer or between the second electrode and the emitting material layer.

According to another aspect of the present disclosure, the present disclosure provides a light-emitting device, for example, a light-emitting display device, including: a substrate; a light-emitting diode on the substrate; and a thin film transistor between the substrate and the light-emitting diode and connected to the light-emitting diode.

Embodiments also relate to a light emitting diode. The light emitting diode includes a first electrode and a second electrode facing the first electrode. The light emitting diode further includes an emitting material layer (EML) disposed between the first electrode and the second electrode, and an electron transport layer (ETL) adjacent to the EML. The ETL includes a plurality of first inorganic particles having a first average particle size, and a plurality of second inorganic particles having a second average particle size greater than the first average particle size.

Embodiments also relate to a light emitting diode. The light emitting diode includes a first electrode and a second electrode facing the first electrode. The light emitting diode further includes an emitting material layer (EML) disposed between the first electrode and the second electrode, and an electron transport layer (ETL) adjacent to the EML. The ETL includes a plurality of first inorganic particles having a first energy bandgap, and a plurality of second inorganic particles having a second energy bandgap smaller than the first energy bandgap.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Hereinafter, the present disclosure will be described with reference to the accompanying drawings in case of need.

Figure 1:
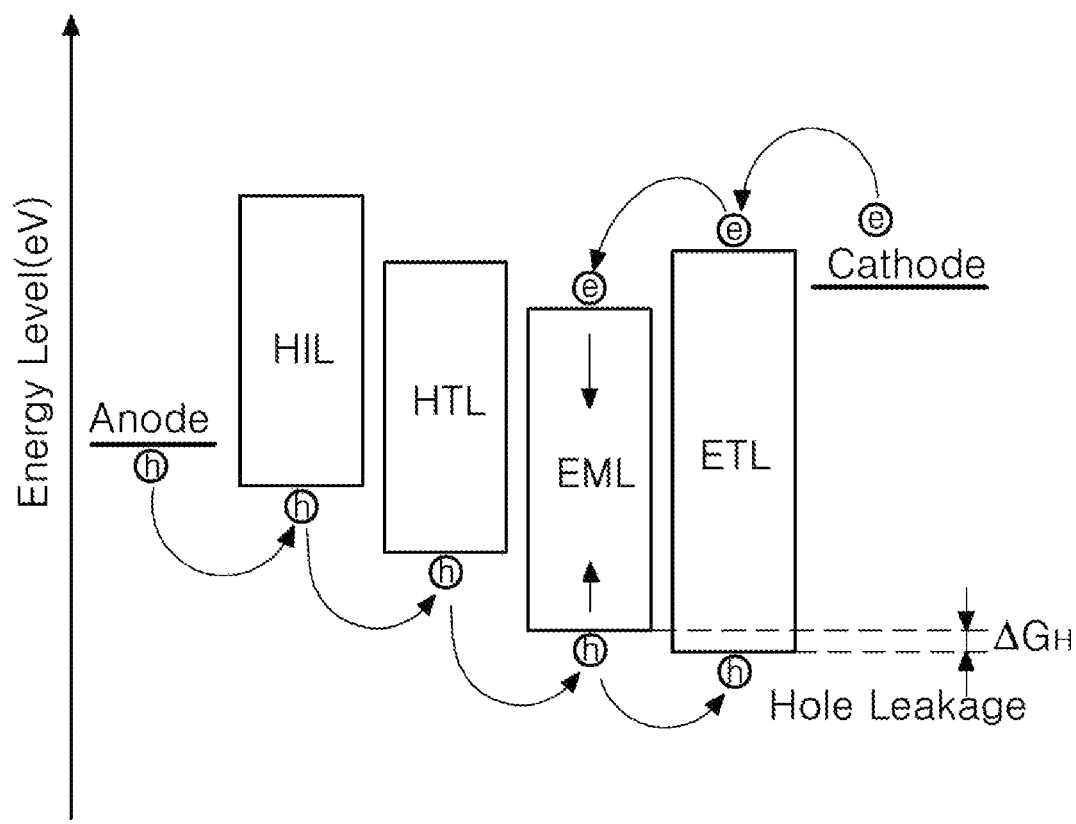
FIG. 1 is a schematic diagram illustrating bandgap energies of electrodes constituting a conventional light-emitting diode (LED) and materials constituting a conventional emissive layer disposed between the electrodes.
Figure 2:
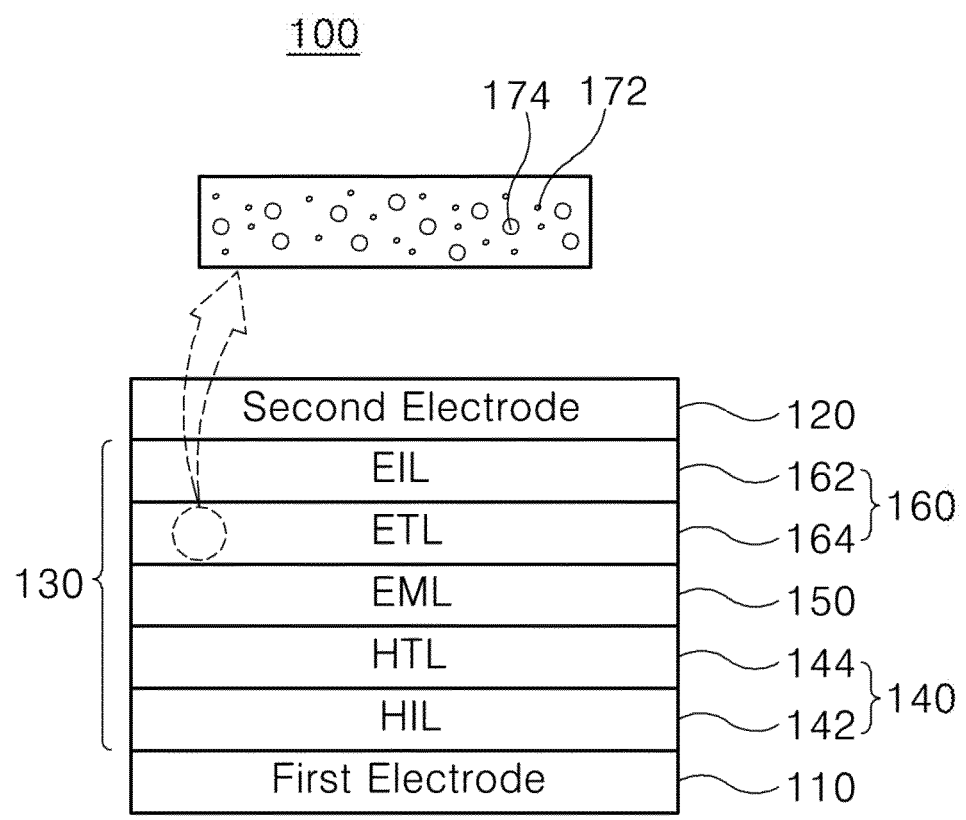
FIG. 2 is a schematic cross-sectional view illustrating an LED having a normal structure according to a first exemplary embodiment of the present disclosure.
Figure 3:
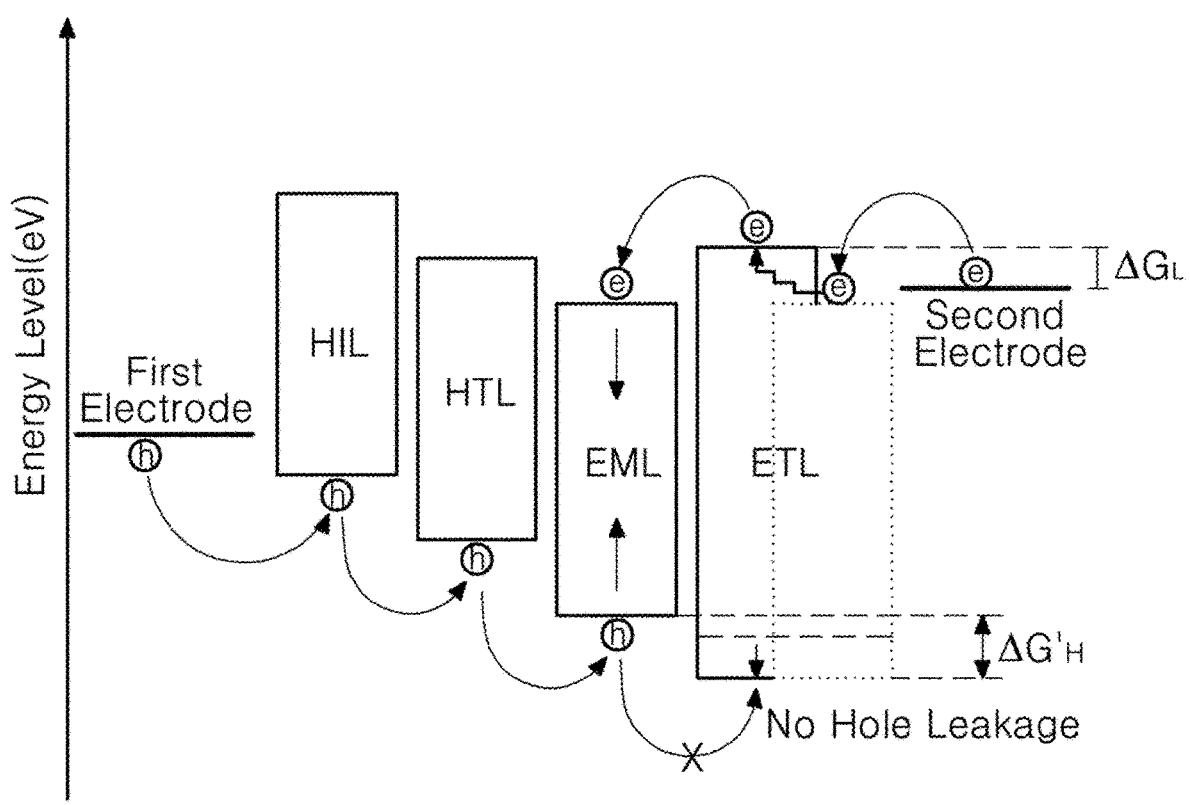
FIG. 3 is a schematic diagram illustrating bandgap energies of electrodes constituting the LED according to the first exemplary embodiment of the present disclosure and materials constituting an emissive layer.

FIG. 2 is a schematic cross-sectional view illustrating a light-emitting diode (LED) 100 having a normal structure according to a first exemplary embodiment of the present disclosure, and FIG. 3 is a schematic diagram illustrating bandgap energies of electrodes constituting the LED 100 according to the first exemplary embodiment of the present disclosure and materials constituting an emissive layer 130.

As shown in FIG. 2, the LED 100 according to the exemplary embodiment of the present disclosure includes a first electrode 110, and a second electrode 120 facing the first electrode 110, and the emissive layer 130 disposed between the first electrode 110 and the second electrode 120 and including an emitting material layer (EML) 150. In an example, the emissive layer 130 may further include a first charge transfer layer 140 disposed between the first electrode 110 and the EML 150 and a second charge transfer layer 160 disposed between the EML 150 and the second electrode 120.

In the first exemplary embodiment of the present disclosure, the first electrode 110 may be an anode such as a hole injection electrode. The first electrode 110 may be formed on a substrate (not shown in FIG. 2), which may be made of glass or a polymer. In an example, the first electrode 10 may be made of at least one selected from doped or undoped metal oxides including indium tin oxide (ITO), indium zinc oxide (IZO), indium tin zinc oxide (ITZO), indium copper oxide (ICO), tin oxide (SnO$_2$), indium oxide (In$_2$O$_3$), cadmium:zinc oxide (Cd:ZnO), fluorine:tin oxide (F:SnO$_2$), indium:tin oxide (In:SnO$_2$), gallium:tin oxide (Ga:SnO$_2$), and aluminum:zinc oxide (Al:ZnO (AZO)). Optionally, the first electrode 110 may be made of a metal material such as nickel (Ni), platinum (Pt), gold (Au), silver (Ag), or iridium (Ir), or a nonmetal material such as a carbon nanotube (CNT) in addition to the above-described metal oxides.

In the first exemplary embodiment of the present disclosure, the second electrode 120 may be a cathode such as an electron injection electrode. In an example, the second electrode 120 may be made of at least one selected from Ca, Ba, Ca/Al, LiF/Ca, LiF/Al, BaF$_2$/Al, CsF/Al, CaCO$_3$/Al, BaF$_2$/Ca/Al, Al, Mg, Au:Mg, and Ag:Mg. For example, each of the first electrode 110 and the second electrode 120 may be stacked to have a thickness of about 30 nm to about 300 nm.

In an exemplary embodiment, in the case of a bottom emission-type LED, the first electrode 110 may be made of a transparent conductive material such as ITO, IZO, ITZO, or AZO, and the second electrode 120 may be made of Ca, Ba, Ca/Al, LiF/Ca, LiF/Al, BaF$_2$/Al, Al, Mg, an Ag:Mg alloy, or the like.

The first charge transfer layer 140 constituting the emissive layer 130 is disposed between the first electrode 110 and the EML 150. In the first exemplary embodiment of the present disclosure, the first charge transfer layer 140 may be a hole transfer layer configured to supply holes to the EML 150. In an example, the first charge transfer layer 140 includes a hole injection layer (HIL) 142 disposed adjacent to the first electrode 110 between the first electrode 110 and the EML 150 and an HTL 144 disposed adjacent to the EML 150 between the first electrode 110 and the EML 150.

The HIL 142 facilitates the injection of holes into the EML 150 from the first electrode 110. In an example, the HIL 142 may be made of an organic material selected from the group consisting of poly(ethylenedioxythiophene):polystyrenesulfonate (PEDOT:PSS), 4,4',4"-tris(diphenylamino)triphenylamine (TDATA) doped with tetrafluoro-tetracyanoquinodimethane (F4-TCNQ), e.g., p-doped phthalocyanine such as zinc phthalocyanine (ZnPc) doped with F4-TCNQ, N,N'-diphenyl-N,N'-bis(1-naphthyl)-1,1'-biphenyl-4,4"-diamine (α-NPD) doped with F4-TCNQ, hexaazatriphenylene-hexanitrile (HAT-CN), and combinations thereof, but the present disclosure is not limited thereto. In an example, a dopant such as F4-TCNQ may be doped at a ratio of about 1 wt % to about 30 wt % with respect to the weight of a host. The HIL 142 may be omitted according to the structure and shape of the LED 100.

The HTL 144 transports holes from the first electrode 110 to the EML 150. The HTL 144 may be made of an inorganic material or an organic material. In an example, when the HTL 144 is made of the organic material, the HTL 144 may be made of an organic material selected from the group consisting of arylamines such as 4,4'-N,N'-dicarbazolyl-biphenyl (CBP), N,N'-diphenyl-N,N'-bis(1-naphtyl)-1,1'-biphenyl-4,4"-diamine (α-NPD), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenyl-benzidine (DNTPD), 4,4',4"-tris(N-carbazolyl)-triphenylamine (TCTA), 4,4',4"-tris((3-methylphenyl)phenylamino)triphenylamine (m-MTDATA), poly(9,9'-dioctylfluorenyl-2,7-diyl)-co-(4,4'-(N-(4-sec-butylphenyl) diphenylamine (TFB), and poly(4-butylphenyl-diphnehyl amine (poly-TPD); polyaniline; polypyrrole; poly(p-phenylenevinylene) (PPV) and a derivative thereof such as poly[2-methoxy-5-(2-ethylhexyloxy)-1,4-phenylenevinylene (MEH-PPV) or poly[2-methoxy-5-(3',7'-dimethyloctyloxy)-1,4-phenylenevinylene (MOMO-PPV); copper phthalocyanine; an aromatic tertiary amine or polynuclear aromatic tertiary amine; a 4,4'-bis(p-carbazolyl)-1,1'-biphenyl compound; N,N,N',N'-tetraarylbenzidine; PEDOT:PSS and a derivative thereof; poly(N-vinylcarbazole) (PVK) and a derivative thereof; polymethacrylate and a derivative thereof; poly(9,9-octylfluorene) and a derivative thereof; poly(spiro-fluorene) and a derivative thereof; N,N'-di(naphthalene-1-yl)-N,N'-diphenyl-benzidine (NPB); Spiro-NPB; and combinations thereof.

When the HTL 144 is made of the inorganic material, the HTL 144 may be made of an inorganic material selected from the group consisting of metal oxides such as NiO, MoO$_3$, Cr$_2$O$_3$, Bi$_2$O$_3$, or p-type ZnO; a non-oxide equivalent such as copper thiocyanate (CuSCN), Mo$_2$S, or p-type GaN; and combinations thereof.

The first charge transfer layer 140 is divided into the HIL 142 and the HTL 144 in the drawings, but the first charge transfer layer 140 may be formed as a single layer. For example, the HIL 142 may be omitted, and the first charge transfer layer 140 may include only the HTL 144 and may be formed by doping a hole injection material (for example, PEDOT:PSS) into the above-described hole transport organic material.

The first charge transfer layer 140 including the HIL 142 and the HTL 144 may be formed using a vacuum deposition process including a vacuum vapor deposition process and a sputtering process, or a solution process such as one from a spin coating method, a drop coating method, a dip coating method, a spray coating method, a roll coating method, a flow coating method, a casting process, a screen printing method, an inkjet printing method, or combinations thereof. For example, each of the HIL 142 and the HTL 144 may have a thickness of about 10 nm to about 200 nm, preferably, a thickness of about 10 nm to about 100 nm, but the present disclosure is not limited thereto.

The EML 150 may be made of inorganic luminescent particles or an organic light-emitting material. When the EML 150 is made of the inorganic luminescent particles, the inorganic luminescent particles may include inorganic luminescent nanoparticles such as quantum dots (QDs) or quantum rods (QRs).

Quantum dots or quantum rods are inorganic particles in which electrons in an unstable state descend from a conduction band to a valence band to emit light. Since the inorganic luminescent nanoparticles have a very high extinction coefficient and high quantum yield among inorganic particles, the inorganic luminescent nanoparticles generate strong fluorescence. In addition, since an emission wavelength is changed according to a size of the inorganic luminescent nanoparticles, the size of the inorganic luminescent nanoparticles may be adjusted to obtain light in a whole range of visible light, thereby realizing various colors. That is, when the inorganic luminescent nanoparticles such as the quantum dots or quantum rods are used as a light-emitting material of the EML 150, it is possible to increase the color purity of each pixel and realize white light composed of red (R) light, green (G) light, and blue (B) light, having high purity.

In an exemplary embodiment, the quantum dots or quantum rods may have a single structure. In another exemplary embodiment, the quantum dots or quantum rods may have a heterostructure of a core/shell. In this case, the shell may be provided as one shell or a multi-shell.

A degree of growth, a crystal structure, and the like of the inorganic luminescent nanoparticles may be adjusted according to reactivity and an injection rate of a reaction precursor constituting the core and/or the shell, and a type and reaction temperature of a ligand. Thus, it is possible to induce emission of light having various wavelength ranges according to an adjustment of an energy bandgap.

In an example, quantum dots or quantum rods may have a heterostructure in which a core component emitting light is located at a center thereof and a shell surrounds a surface of the core to protect the core. A ligand component may surround a surface of the shell so as to disperse quantum dots or quantum rods in a solvent. For example, the quantum dots or quantum rods have a structure in which a component constituting the core and having an energy bandgap is surrounded by the shell having an energy bandgap. The quantum dots or quantum rods may have a type-I core/shell structure which is an illuminant in which electrons and holes move to the core and are recombined in the core to convert energy into light and emit the light.

When the quantum dots or quantum rods constitute the type-I core/shell structure, the core is a portion which substantially emits light, and an emission wavelength of the quantum dots or quantum rods is determined according to a size of the core. In order to obtain a quantum confinement effect, the core should have a size smaller than an exciton Bohr radius according to each material and should have an optical band gap at a corresponding size thereof.

Meanwhile, the shell constituting the quantum dots or quantum rods promotes the quantum confinement effect of the core and determines stability of the quantum dots or quantum rods. Unlike internal atoms, atoms appearing on a surface of colloidal quantum dots or quantum rods having a single structure have lone pair electrons which do not participate in a chemical bond. Since an energy level of the surface atoms is placed between a conduction band edge and a valence band edge of the quantum dots or quantum rods, electric charges may be trapped to form surface defects. Due to a non-radiative recombination process of excitons, caused by the surface defects, luminous efficiency of the quantum dots or quantum rods can be reduced. In addition, the trapped electric charges react with external oxygen and compounds to cause a chemical composition variation of the quantum dots or quantum rods, or the quantum dots or quantum rods can permanently lose electrical/optical properties thereof.

Thus, in an exemplary embodiment, the quantum dots or quantum rods may have a heterostructure of a core/shell. In order for the shell to be efficiently formed on a surface of the core, a lattice constant of a material constituting the shell should be similar to a lattice constant of a material constituting the core. Since the surface of the core is surrounded by the shell, oxidation of the core can be prevented to improve chemical stability of the quantum dots or quantum rods, loss of excitons caused by surface trapping on the surface of the core can be minimized, and energy loss due to molecular vibration can be prevented, thereby improving quantum efficiency.

Quantum dots or quantum rods may be semiconductor nanocrystals or metal oxide particles having a quantum confinement effect. For example, the quantum dots or quantum rods may include a group II-VI, group III-V, group IV-VI, or group nano semiconductor compound. More specifically, a core and/or a shell constituting the quantum dots or quantum rods may be group II-VI compound semiconductor nanocrystals such as CdS, CdSe, CdTe, ZnS, ZnSe, ZnTe, HgS, HgTe and/or combinations thereof; group III-V compound semiconductor nanocrystals such as GaP, GaAs, GaSb, InP, InAs, InSb, and/or combinations thereof; group IV-VI compound semiconductor nanocrystals such as PbS, PbSe, PbTe, and/or combinations thereof; group compound semiconductor nanocrystals such as $AgGaS_2$, $AgGaSe_2$, $AgGaTe_2$, $CuInS_2$, $CuInSe_2$, $CuGaS_2$, $CuGaSe_2$ and/or combinations thereof; metal oxide nanoparticles such as ZnO, $TiO_2$, and/or a combination thereof; and/or core-shell structured nanocrystals such as CdSe/ZnSe, CdSe/ZnS, CdS/ZnSe, CdS/ZnS, ZnSe/ZnS, InP/ZnS, ZnO/MgO, and/or any combination thereof. Semiconductor nanoparticles may be undoped or doped with a rare earth element such as Eu, Er, Tb, Tm, Dy, or any combination thereof, or may be doped with a transition metal element such as Mn, Cu, Ag, or any combination thereof.

For example, the core constituting the quantum dot or the quantum rod may be selected from the group consisting of ZnSe, ZnTe, CdSe, CdTe, InP, ZnCdS, $Cu_xIn_{1-x}S$, $Cu_xIn_{1-x}Se$, $Ag_xIn_{1-x}S$, and combinations thereof. In addition, shell constituting the quantum dot or quantum rod may be selected from the group consisting of ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $Cd_xZn_{1-x}S$, and combinations thereof.

Meanwhile, the quantum dots may be alloy quantum dots (QDs) (e.g., $CdS_xSe_{1-x}$, $CdSe_xTe_{1-x}$, or $Zn_xCd_{1-x}Se$), such as homogeneous alloy quantum dots or gradient alloy quantum dots.

When the EML 150 is made of inorganic luminescent particles such as quantum dots or quantum rods, the EML 150 is formed by applying a solution containing quantum dots or quantum rods in a solvent on the first charge transfer layer 140, for example, the HTL 144 through a solution process, and then, volatilizing the solvent.

In an exemplary embodiment, the EML 150 may be formed by applying a dispersion containing luminescent particles such as quantum dots or quantum rods in a solvent on the first charge transfer layer 140 through a solution process, and then, volatilizing the solvent. The EML 150 may be stacked by using a solution process such as one from among a spin coating method, a drop coating method, a dip coating method, a spray coating method, a roll coating method, a flow coating method, a casting process, a screen printing method, and an inkjet printing method or combinations thereof.

In an exemplary embodiment, a white LED may be manufactured by including organic luminescent nanoparticles such as quantum dots or quantum rods, having about 440 nm, about 530 nm, or about 620 nm PL emission properties in the EML 150. Optionally, the EML 150 may include luminescent nanoparticles such as quantum dots or quantum rods, having any one color of a red color, a green color, and a blue color and may be implemented to individually emit any one of red light, green light, and blue light.

In another alternative embodiment, the EML 150 may be made of an organic light-emitting material. When the EML 150 is made of the organic light-emitting material, the organic light-emitting material is not particularly limited as long as it is a commonly used organic light-emitting material. For example, the EML 150 may include an organic light-emitting material emitting red light, green light, and/or blue light and may include a fluorescent material or a phosphorescent material. In addition, the organic light-emitting material constituting the EML 150 may include a host and a dopant. When the organic light-emitting material is configured as a host-dopant system, a dopant may be doped at a ratio of about 1-50 wt %, preferably, about 1-30 wt % with respect to the weight of a host, but the present disclosure is not limited thereto.

An organic host used in the EML 150 is not particularly limited as long as it is a commonly used material. In an example, the organic host used in the EML 150 may include at least one selected from tris(8-hydroxyquinoline)aluminum ($Alq_3$), TCTA, PVK, 4,4'-bis(N-carbazolyl)-1,1'-biphenyl (CBP), 4,4'-bis(9-carbazolyl)-2,2'-dimethylbiphenyl (CDBP), 9,10-di(naphthalene-2-yl)anthracene (ADN), 3-tert-butyl-9,10-di(naphtha-2-yl)anthracene (TBADN), 2-methyl-9,10-bis(naphthalene-2-yl)anthracene (MADN), 1,3,5-tris(N-phenylbenzimidazole-2-yl)benzene (TPBi), distyrylarylene (DSA), mCP, 1,3,5-tris(carbazol-9-yl)benzene (TCP), and the like.

When the EML 150 emits red light, a dopant included in the EML 150 may include an organic compound or an organic metal complex such as 5,6,11,12-tetraphenylnaphthalene (rubrene), bis(2-benzo[b]-thiophene-2-yl-pyridine)(acetylacetonate)iridium (□) (Ir(btp)$_2$(acac)), bis[1-(9,9-dimethyl-9H-fluoren-2-yl)-isoquinoline](acetylacetonate)iridium (□) (Ir(fliq)$_2$(acac)), bis[2-(9,9-diemthyl-9H-fluoren-2-yl)-quinoline](acetylacetonate)iridium (□) (Ir(flq)$_2$(acac)), bis-(2-phenylquinoline)(2-(3-methylphenyl)pyridinate)iridium (□) (Ir(phq)$_2$typ), or iridium(□)bis(2-(2,4-difluorophenyl)quinoline)picolinate (FPQIrpic), but the present disclosure is not limited thereto.

When the EML 150 emits green light, a dopant included in the EML 150 may include an organic compound or an organic metal complex such as N,N'-dimethyl-quinacridone (DMQA), 9,10-bis[N,N-di-(p-tolyl)amino]anthracene (TTPA), 9,10-bis[phenyl(m-tolyl)-amino]anthracene (TPA), bis(2-phenylpyridine)(acetylacetonate)iridium (□) (Ir(ppy)$_2$(acac)), fac-tris(phenylpyridine)iridium (□) (fac-Ir(ppy)$_3$), or tris[2-(p-tolyl)pyridine]iridium (□) (Ir(mppy)$_3$), but the present disclosure is not limited thereto.

When the EML 150 emits blue light, a dopant included in the EML 150 may include an organic compound or an organic metal complex such as 4,4'-bis[4-(di-p-tolylamino)styryl]biphenyl (DPAVBi), perylene, 2,5,8,11-tetra-tert-butylpherylene (TBPe), bis[3,5-difluoro-2-(2-pyridyl)phenyl-(2-carboxypyridyl)]iridium (III) (FirPic), mer-tris(1-phenyl-3-methylimidazolin-2-ylidene-C,C(2)'iridium (□) (mer-Ir(pmi)$_3$), or tris(2-(4,6-difluorophenyl)pyridine)iridium (□) (Ir(Fppy)$_3$), but the present disclosure is not limited thereto.

When the EML 150 is made of an organic light-emitting material, the EML 150 may be formed by using a vacuum deposition process including a vacuum vapor deposition process and a sputtering process, or a solution process such as one from among a spin coating method, a drop coating method, a dip coating method, a spray coating method, a roll coating method, a flow coating method, a casting process, a screen printing method, and an inkjet printing method or combinations thereof.

Meanwhile, the second charge transfer layer 160 is disposed between the EML 150 and the second electrode 120. In the present embodiment, the second charge transfer layer 160 may be an electron transfer layer configured to supply electrons to the EML 150. In an exemplary embodiment, the second charge transfer layer 160 includes an electron injection layer (EIL) 162 disposed adjacent to the second electrode 120 between the second electrode 120 and the EML 150 and an electron transport layer (ETL) 164 disposed adjacent to the EML 150 between the second electrode 120 and the EML 150.

The EIL 162 facilitates the injection of electrons into the EML 150 from the second electrode 120. For example, the EIL 162 may be made of a material in which fluorine is doped into or bonded to a metal such as Al, Cd, Cs, Cu, Ga, Ge, In, or Li, or may be made of a metal oxide such as titanium dioxide (TiO$_2$), zinc oxide (ZnO), zirconium oxide (ZrO$_2$), tin oxide (SnO$_2$), tungsten oxide (WO$_3$), or tantalum oxide (Ta$_2$O$_3$), which is doped or not doped with Al, Mg, In, Li, Ga, Cd, Cs, Cu, or the like.

The ETL 164 transports electrons to the EML 150. The ETL 164 may be made of inorganic particles.

According to the present disclosure, the ETL 164 includes first inorganic particles 172 having a first average particle size and second inorganic particles 174 having a second average particle size greater than the first average particle size. The first inorganic particles 172 and the second inorganic particles 174 may have various shapes. For example, the first inorganic particles 172 and the second inorganic particles 174 may have spherical shapes, but is not limited hereto. The size of a particle may be determined, for example, as a distance along an axis of the particle from a first surface to a second surface of the particle. Depending on the measurement techniques, for example, the particle may be assumed to have a spherical shape, and the diameter of the spherical shape may be determined as the size of the particle.

For example, the first inorganic particles 172 and the second inorganic particles 174 may include metal and/or nonmetal oxide particles, semiconductor particles, nitrides, and combinations thereof. The metal and/or nonmetal oxide particles may include titanium dioxide (TiO$_2$), zinc oxide (ZnO), zinc magnesium oxide (ZnMgO$_2$), zirconium oxide (ZrO$_2$), tin oxide (SnO$_2$), tungsten oxide (WO$_3$), tantalum oxide (Ta$_2$O$_3$), hafnium oxide (HfO$_3$), aluminum oxide (Al$_2$O$_3$), zirconium silicon oxide (ZrSiO$_4$), barium titanium oxide (BaTiO$_3$), and/or barium zirconium oxide (BaZrO$_3$), but the present disclosure is not limited thereto. The semiconductor particles may include CdS, ZnSe, and ZnS, and the nitrides may include Si$_3$N$_4$, but the present disclosure is not limited thereto. In particular, since oxide particles have high electron injection properties to improve luminous efficiency of the LED 100, the first inorganic particles 172 and the second inorganic particles 174 are preferably the metal and/or nonmetal oxide particles.

In an exemplary embodiment, the metal and/or nonmetal oxide particles and/or the semiconductor particles constituting the first inorganic particles 172 and the second inorganic particles 174 may be not doped or doped with Al, Mg, In, Li, Ga, Cd, Cs, Cu, or the like.

According to an exemplary embodiment of the present disclosure, the first inorganic particles 172 having a relatively small average particle size have a high conduction band energy level, that is, a high lowest unoccupied molecular orbital (LUMO) energy level. That is, as schematically shown in FIG. 3, when the ETL 164 includes only the first inorganic particles 172 having a small average particle size, a difference $\Delta G_L$ between a LUMO energy level of the ETL 164 and a LUMO energy level of the second electrode 120 may be greatly increased. The first inorganic particles 172 may have a greater energy bandgap than the second inorganic particles 174.

Thus, an energy barrier is generated between the second electrode 120 and the ETL 164 to delay the transport/injection of electrons into the ETL 164 from the second electrode 120. Since the injection of electrons into the EML 150 is delayed when compared to the injection of holes into the EML 150 from the first electrode 110, electric charges injected into the EML 150 may be unbalanced. Some of the holes, which are excessively injected when compared to electrons, disappear without forming excitons, and light is emitted at an interface between the EML 150 and the ETL 164 rather than a light-emitting material constituting the EML 150. Therefore, luminous efficiency of the LED 100 is decreased, and a driving voltage thereof rises.

On the other hand, the second inorganic particles 174 having a large average particle size have a conduction band energy level, that is, a LUMO energy level deeper or lower than that of the first inorganic particles 172. Therefore, although there is no energy barrier between the second electrode 120 and the ETL 164, the number of effective electrons injected into the EML 150 from the ETL 164 having the deep LUMO energy level is reduced. Thus, current leakage occurs, and luminous efficiency is decreased.

In the present disclosure, the inorganic particles 172 and 174 having different average particle sizes are used in the ETL 164 to remove a LUMO energy barrier of the ETL 164 with respect to the second electrode 120 and to effectively inject electrons into the EML 150. That is, as schematically shown in FIG. 3, since the ETL 164 includes the second inorganic particles 174 having the deep LUMO energy level, there is no LUMO energy barrier between the second electrode 120 and the ETL 164. Therefore, electrons generated in the second electrode 120 may be rapidly injected into the ETL 164.

Meanwhile, since the ETL 164 includes the first inorganic particles 172 having the relatively high LUMO energy level, electrons injected into the ETL 164 gradually move to the high LUMO energy level of the first inorganic particles 172 included in the identical ETL 164. That is, since the electrons injected into the ETL 164 are finally transferred and injected into the EML 150 at the LUMO energy level of the first inorganic particles 172, the number of effective electrons injected into the EML 150 is not reduced, and thus, current leakage is prevented to improve luminous efficiency of LED 100.

In addition, in the LED 100 according to the first exemplary embodiment of the present disclosure, the ETL 164 includes the inorganic particles 172 and 174 having a sufficiently deep or lower highest occupied molecular orbital (HOMO) energy level in comparison to the light-emitting material constituting the EML 150. For example, a highest occupied molecular orbital (HOMO) energy level of the plurality of first inorganic particles and the HOMO energy level of the plurality of second inorganic particles may be lower than a HOMO energy level of an oxadiazole-based, triazole-based, benzoxazole-based, benzothiazole-based, benzimidazole-based, or triazine-based organic compound that is used as the material of the ETL in a related art light emitting diode device. Accordingly, a difference $\Delta G'_H$ between a HOMO energy level of the EML 150 and a HOMO energy level of the ETL 164 is increased. An energy barrier, by which holes are not transported to the ETL 164 from the EML 150, may be generated, thereby preventing holes injected into the EML 150 from being leaked into the ETL 164. As described above, according to the present disclosure, the ETL 164 may include the inorganic particles 172 and 174 having different particle sizes together, thereby improving emission properties such as luminous efficiency and quantum efficiency of the LED 100.

The first inorganic particles 172 and the second inorganic particles 174 constituting the ETL 164 may be prepared through a method commonly used to prepare metal/non-metal oxide particles, semiconductor particles, and nitrides, where each are nano-sized. In an example, when the first inorganic particles 172 and the second inorganic particles 174 are metal oxide particles, the first inorganic particles 172 and the second inorganic particles 174 may be prepared by using 1) a co-precipitation method in which various different ions are simultaneously precipitated in an aqueous solution or a non-aqueous solution, 2) a sol-gel method, 3) a hydrothermal synthesis method in which the temperature and pressure of a homogeneous aqueous solution or a suspension are raised, or the like.

For example, in the co-precipitation method, insoluble hydroxides, carbonates, oxalates, or the like are finely mixed and decomposed to produce metal oxide particles. In an example of the co-precipitation method, a metal salt such as a metal alkoxide (for example, isopropoxide, butoxide, or propoxide of Ti/Zr) may be mixed in an alcohol solution to prepare metal oxide particles through hydrolysis and pyrolysis due to a reaction between the metal alkoxide and water.

Meanwhile, the sol-gel method is similar to the co-precipitation method, but a hydrolysis reaction slowly proceeds. A gel obtained through hydrolysis and a condensation reaction is heat-treated to remove organic components and to prepare metal oxide particles. The sol-gel method may be classified as a colloid method including forming a raw material solution, i.e., a sol through dispersion of colloid particles in a solution, and allowing the sol to gelate through destabilization of a sol state, and a method including forming a sol using a metal organic compound such as an alkoxide, allowing the sol to gelate through hydrolysis and a concentration reaction, and then, performing heat treatment to manufacture metal oxide particles.

Inorganic particles having different particle sizes may be prepared by adjusting aging conditions, a thermal reaction temperature, a mixing ratio between a metal organic precursor and a solvent in each of the preparation methods.

In an exemplary embodiment, the first average particle size of the first inorganic particles 172 may be in a range of about 50% to about 85%, preferably, in a range of about 50% to about 75% of the second average particle size of the second inorganic particles 174. When the first average particle size of the first inorganic particles 172 exceeds 85% of the second average particle size of the second inorganic particles 174, the advantage of using two inorganic particles having different particle sizes together may be offset.

In addition, in an exemplary embodiment, the first inorganic particles 172 and the second inorganic particles 174 are mixed at a weight ratio of about 1:4 to about 4:1, preferably, a weight ratio of about 1:3 to about 3:1, and more preferably, a weight ratio of about 1:2 to about 2:1. When the first inorganic particles 172 are mixed at a ratio less than 1:4 or at a ratio exceeding 4:1 with respect to the second inorganic particles 174, the advantage of using inorganic particles having different particle sizes together may also be offset.

In an example, a content of the first inorganic particles 172 may be greater than or equal to a content of the second inorganic particles 174 in the ETL 164. For example, the first inorganic particles 172 and the second inorganic particles 174 may be mixed at a weight ratio of about 4:1 to about 1:1. In an exemplary embodiment, when metal oxide particles and/or semiconductor particles are used as the first and second inorganic particles 172 and 174, the first average particle size of the first inorganic particles 172 may be in a range of about 3.0 nm to about 5.5 nm, preferably, a range of about 3.0 nm to about 4.5 nm, and the second average particle size of the second inorganic particles 174 may be in a range of about 6.0 nm to about 7.0 nm, but the present disclosure is not limited thereto.

Similar to the first charge transfer layer 140, the second charge transfer layer 160 is illustrated in FIG. 2 as including two layers of the EIL 162 and the ETL 164. However, the second charge transfer layer 160 may include only a single layer of the ETL 164. In addition, the second charge transfer layer 160 may be formed to include a single layer of the ETL 164 in which cesium carbonate is blended with an electron transport material including the above-described inorganic material.

The second charge transfer layer 160 including the EIL 162 and/or the ETL 164 may be formed using a solution process such as one from among a spin coating method, a drop coating method, a dip coating method, a spray coating method, a roll coating method, a flow coating method, a casting process, a screen printing method, and an inkjet printing method or combinations thereof. In an example, each of the EIL 162 and/or the ETL 164 may be stacked to have a thickness of 10 nm to 200 nm, preferably, a thickness of 10 nm to 100 nm.

For example, when a hybrid charge transport layer (CTL) in which the HTL 144 constituting the first charge transfer layer 140 is made of an organic material and the second charge transfer layer 160 is made of an inorganic material, emission properties of the LED 100 can be improved.

Meanwhile, when holes pass through the EML 150 and move to the second electrode 120 or electrons pass through the EML 150 and move to the first electrode 110, a lifespan and efficiency of a device can be reduced. In order to prevent this, the LED 100 according to the first exemplary embodiment of the present disclosure may include at least one exciton blocking layer disposed adjacent to the EML 150.

For example, the LED 100 according to the first exemplary embodiment of the present disclosure may include an electron blocking layer (EBL) configured to control and prevent movement of electrons between the HTL 144 and the EML 150.

In an example, the electron blocking layer may be made of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, tri-p-tolylamine, 1,1-bis[4-[N,N-di(p-tolyl)amino]phenyl]cyclohexane (TAPC), m-MTDATA, 1,3-bis(N-carbazolyl) benzene (mCP), 3,3'-bis (N-carbazolyl)-1,1'-biphenyl (mCBP), Poly-TPD, copper phthalocyanine (CuPc), DNTPD, 1,3,5-tris[4-(diphenylamino)phenyl]benzene (TDAPB), and/or the like.

In addition, a hole blocking layer (HBL) may be disposed as a second exciton blocking layer between the EML 150 and the ETL 164, thereby preventing the movement of holes between the EML 150 and the ETL 164. In an exemplary embodiment, a material of the hole blocking layer may include a derivative of oxadiazole, triazole, phenanthroline, benzoxazole, benzothiazole, benzimidazole, or triazine usable in the ETL 164.

For example, the hole blocking layer may be made of at least one selected from 2,9-dimethyl-4,7-diphenyl-1,10-phenanthroline (BCP), BAlq, Alq$_3$, PBD, spiro-PBD, 8-hydroxy-quinolinato lithium (Liq), and/or like, which have a HOMO energy level deeper or lower than that of a material used in the EML 150.

As described above, according to the first exemplary embodiment of the present disclosure, two types of the inorganic particles 172 and 174 having different average particle sizes are used together in the ETL 164 constituting the second charge transfer layer 160 disposed between the EML 150 and the second electrode 120. Since there is no LUMO energy barrier between the ETL 164 and the second electrode 120 adjacent thereto and the number of effective electrons injected into the EML 150 from the ETL 164 is not reduced, electrons may be rapidly transferred and injected into the EML 150. In addition, as the HOMO energy level of the ETL 164 is much deeper than the HOMO energy level of the EML 150 (i.e., the difference $\Delta G'_H$ between the HOMO energy level of the ETL 164 and the HOMO energy level of the EML 150 is increased), holes do not leak from the EML 150 to the ETL 164. Accordingly, luminous efficiency and quantum efficiency of the LED 100 are improved.

Meanwhile, an LED having the normal structure has been described with reference to FIGS. 2 and 3, the normal structure indicating a structure in which a hole transfer layer is disposed between a first electrode having a relatively low work function value and an EML and an electron transfer layer is disposed between a second electrode having a relatively high work function and the EML. An LED may have an inverted structure rather than a normal structure, and this will be below.

Figure 4:
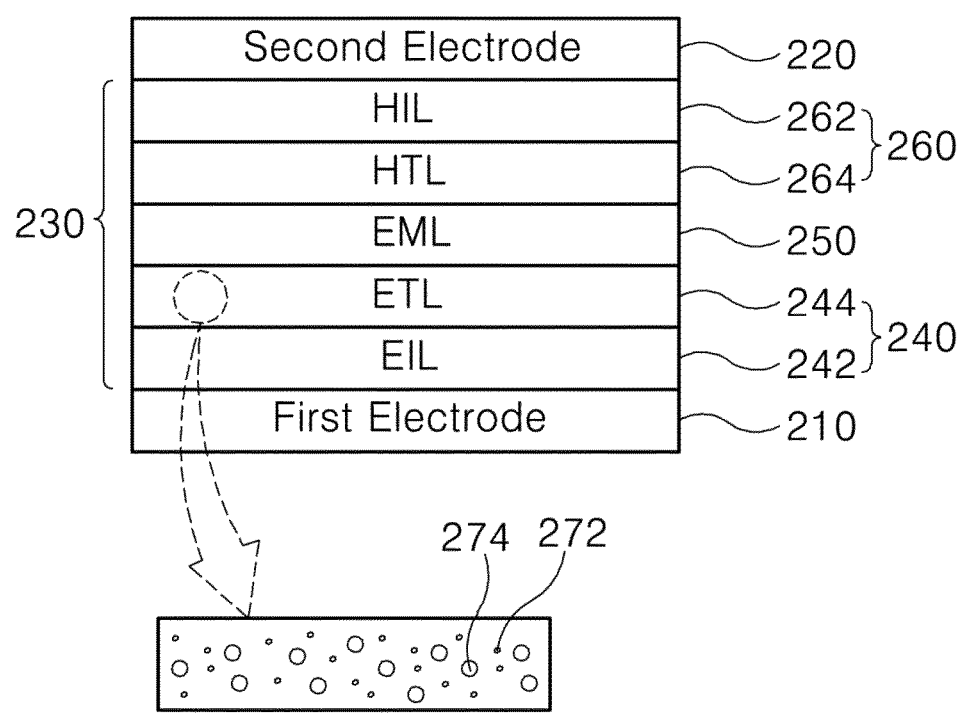
FIG. 4 is a schematic cross-sectional view illustrating an LED having an inverted structure according to a second exemplary embodiment of the present disclosure.
Figure 5:
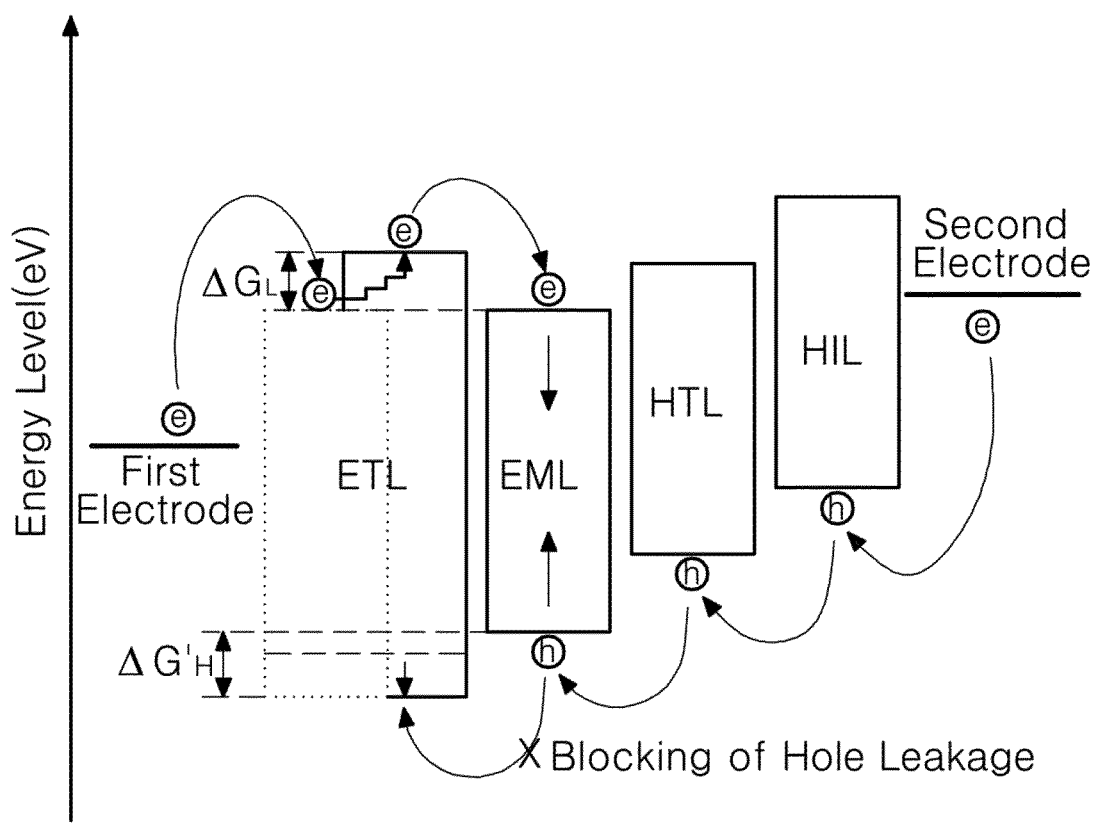
FIG. 5 is a schematic diagram illustrating bandgap energies of electrodes constituting the LED according to the second exemplary embodiment of the present disclosure and materials constituting an emissive layer.

FIG. 4 is a schematic cross-sectional view illustrating an LED 200 having an inverted structure according to a second exemplary embodiment of the present disclosure, and FIG. 5 is a schematic diagram illustrating bandgap energies of electrodes constituting the LED 200 according to the second exemplary embodiment of the present disclosure and materials constituting an emissive layer 230.

As shown FIG. 4, the LED 200 according to the second exemplary embodiment of the present disclosure includes a first electrode 210, a second electrode 220 facing the first electrode 210, and the emissive layer 230 including an EML 250 disposed between the first electrode 210 and the second electrode 220. The emissive layer 230 may further include a first charge transfer layer 240 disposed between the first electrode 210 and the EML 250 and a second charge transfer layer 260 disposed between the second electrode 220 and the EML 250.

In the second exemplary embodiment of the present disclosure, the first electrode 210 may be a cathode such as an electron injection electrode. In an example, the first electrode 210 may be made of a doped or undoped metal oxide such as ITO, IZO, ITZO, ICO, $SnO_2$, $In_2O_3$, Cd:ZnO, F:$SnO_2$, In:$SnO_2$, Ga:$SnO_2$, or AZO, or may be made of a material including nickel (Ni), platinum (Pt), gold (Au), silver (Ag), iridium (Ir), or a carbon nanotube in addition to the above-described metal oxides.

In the second exemplary embodiment of the present disclosure, the second electrode 220 may be an anode such as a hole injection electrode. In an example, the second electrode 220 may be made of at least one selected from Ca, Ba, Ca/Al, LiF/Ca, LiF/Al, BaF$_2$/Al, CsF/Al, CaCO$_3$/Al, BaF$_2$/Ca/Al, Al, Mg, Au:Mg, and Ag:Mg. For example, each of the first electrode 210 and the second electrode 220 may be stacked to have a thickness of 30 nm to 300 nm.

In the second exemplary embodiment of the present disclosure, the first charge transfer layer 240 may be an electron transfer layer configured to supply electrons to the EML 250. In an exemplary embodiment, the first charge transfer layer 240 includes an EIL 242 disposed adjacent to the first electrode 210 between the first electrode 210 and the EML 250 and an ETL 244 disposed adjacent to the EML 250 between the first electrode 210 and the EML 250.

The EIL 242 may be made of a material in which fluorine is doped into or bonded to a metal such as Al, Cd, Cs, Cu, Ga, Ge, In, or Li, or may be made of a metal oxide such as $TiO_2$, ZnO, ZrO, $SnO_2$, $WO_3$, or $Ta_2O_3$, which is doped or not doped with Al, Mg, In, Li, Ga, Cd, Cs, Cu, or the like.

The ETL 244 is made of inorganic particles and includes first inorganic particles 272 having a first average particle size and second inorganic particles 274 having a second average particle size greater than the first average particle size. For example, the first inorganic particles 272 and the second inorganic particles 274 may each include metal and/or nonmetal oxides such as $TiO_2$, ZnO, $ZnMgO_2$, $ZrO_2$, $SnO_2$, $WO_3$, $Ta_2O_3$, $HfO_3$, $Al_2O_3$, $ZrSiO_4$, $BaTiO_3$, and/or $BaZrO_3$, which are not doped or doped with Al, Mg, In, Li, Ga, Cd, Cs, Cu, or the like; semiconductor particles such as CdS, ZnSe, and ZnS, which are doped or not doped with Al, Mg, In, Li, Ga, Cd, Cs, Cu, or the like; a nitride such as $Si_3N_4$, and combinations thereof. The first inorganic particles 272 and the second inorganic particles 274 may be prepared, for example, through a co-precipitation method, a sol-gel method, a hydrothermal synthesis method, or the like.

Similar to the above-described first exemplary embodiment, the first average particle size of the first inorganic particles 272 is in a range of about 50% to about 85%, preferably, in a range of about 50% to about 75% of the second average particle size of the second inorganic particles 274. In addition, the first inorganic particles 272 and the second inorganic particles 274 are mixed at a weight ratio of about 1:4 to about 4:1, preferably, a weight ratio of about 1:3 to about 3:1, and more preferably, a weight ratio of about 1:2 to about 2:1. For example, a content of the first inorganic particles 272 may be greater than or equal to a content of the second inorganic particles 274 in the ETL 244. When metal oxide particles and/or semiconductor particles are used as the first and second inorganic particles 272 and 274, the first average particle size of the first inorganic particles 272 may be in a range of about 3.0 nm to about 5.5 nm, preferably, a range of about 3.0 nm to about 4.5 nm, and the second average particle size of the second inorganic particles 274 may be in a range of about 6.0 nm to about 7.0 nm, but the present disclosure is not limited thereto.

Meanwhile, the first charge transfer layer 240 may include only a single layer of the ETL 244. In addition, the first charge transfer layer 240 may be formed to include a single layer of the ETL 244 in which cesium carbonate is blended with an electron transport material including the above-described inorganic material. In an example, each of the EIL 242 and the ETL 244 may be stacked to have a thickness of about 10 nm to about 200 nm, preferably, a thickness of 10 nm to 100 nm.

The EML 250 may be made of inorganic luminescent particles or an organic light-emitting material. The inorganic luminescent particles may be inorganic luminescent nanoparticles such as quantum dots or quantum rods. Quantum dots or quantum rods may have a single structure or a heterologous structure of a core/shell.

Quantum dots or quantum rods may be semiconductor nanocrystals or metal oxide particles having a quantum confinement effect. For example, the quantum dots or quantum rods may include a group II-VI, group III-V, group IV-VI, or group nano semiconductor compound. More specifically, the core and/or shell constituting quantum dots or quantum rods may be II-VI group compound semiconductor nanocrystals such as CdS, CdSe, CdTe, ZnS, ZnSe, ZnTe, HgS, HgTe and/or combinations thereof; group III-V or group IV compound semiconductor nanocrystals such as GaP, GaAs, GaSb, InP, InAs, InSb, and/or combinations thereof; group IV-VI compound semiconductor nanocrystals such as PbS, PbSe, PbTe, and/or combinations thereof; group compound semiconductor nanocrystals such as $AgGaS_2$, $AgGaSe_2$, $AgGaTe_2$, $CuInS_2$, $CuInSe_2$, $CuGaS_2$, $CuGaSe_2$ and/or combinations thereof; metal oxide nanoparticles such as ZnO, $TiO_2$, and/or a combination thereof; and/or core-shell structured nanocrystals such as CdSe/ZnSe, CdSe/ZnS, CdS/ZnSe, CdS/ZnS, ZnSe/ZnS, InP/ZnS, ZnO/MgO, and/or combinations thereof. Semiconductor nanoparticles may be undoped or doped with a rare earth element such as Eu, Er, Tb, Tm, Dy, or any combination thereof, or may be doped with a transition metal element such as Mn, Cu, Ag, or any combination thereof.

When the EML 250 is made of inorganic luminescent particles such as quantum dots or quantum rods, the EML 250 is formed by applying a solution containing quantum dots or quantum rods in a solvent on the first charge transfer layer 240, for example, the ETL 244 through a solution process, and then, volatilizing the solvent.

When the EML 250 is made of an organic light-emitting material, the EML 250 may be made of an organic light-emitting material emitting red light, green light, and/or blue light and may include a fluorescent material or a phosphorescent material. In addition, the organic light-emitting material constituting the EML 250 may include a host and a dopant. When the organic light-emitting material is configured as a host-dopant system, a dopant may be doped at a ratio of about 1-50 wt %, preferably, about 1-30 wt % with respect to the weight of a host, but the present disclosure is not limited thereto.

When the EML 250 is made of the organic light-emitting material, the EML 250 may be formed using a vacuum deposition process including a vacuum vapor deposition process and a sputtering process, and a solution process such as one from among a spin coating method, a drop coating method, a dip coating method, a spray coating method, a roll coating method, a flow coating method, a casting process, a screen printing method, and an inkjet printing method or combinations thereof.

In the second exemplary embodiment of the present disclosure, the second charge transfer layer 260 may be a hole transfer layer configured to supply holes to the EML 250. In an exemplary embodiment, the second charge transfer layer 260 includes an HIL 262 disposed adjacent to the second electrode 220 between the second electrode 220 and the EML 250 and an HTL 264 disposed adjacent to the EML 250 between the second electrode 220 and the EML 250.

The HIL 262 may be made of a material selected from the group consisting of PEDOT:PSS, TDATA doped with F4-TCNQ, e.g., p-doped phthalocyanine such as ZnPc doped with F4-TCNQ, α-NPD doped with F4-TCNQ, HAT-CN, and combinations thereof, but the present disclosure is not limited thereto. In an example, a dopant such as F4-TCNQ may be doped at a ratio of about 1 wt % to about 30 wt % with respect to the weight of a host. The HIL 262 may be omitted according to the structure and shape of the LED 200.

The HTL 264 may be made of an inorganic material or an organic material. In an example, when the HTL 264 is made of the organic material, the HTL 264 may be made of an organic material selected from the group consisting of arylamines such as CBP, α-NPD, TPD, spiro-TPD, DNTPD, TCTA, m-MTDATA, TFB, and poly-TPD; polyaniline; polypyrrole; poly(p-phenylenevinylene (PPV)) and a derivative thereof such as MEH-PPV or MOMO-PPV; copper phthalocyanine; an aromatic tertiary amine or polynuclear aromatic tertiary amine; a 4,4'-bis(p-carbazolyl)-1,1'-biphenyl compound; N,N,N',N'-tetraarylbenzidine; PEDOT:PSS and a derivative thereof; poly-N-vinylcarbazole and a derivative thereof; polymethacrylate and a derivative thereof; poly(9,9-octylfluorene) and a derivative thereof; poly (spiro-fluorene) and a derivative thereof; NPB; Spiro-NPB; and combinations thereof.

When the HTL 264 is made of the inorganic material, the HTL 264 may be made of an inorganic material selected from the group consisting of metal oxides such as NiO, $MoO_3$, $Cr_2O_3$, $Bi_2O_3$, or p-type ZnO; a non-oxide equivalent such as copper thiocyanate (CuSCN), $Mo_2S$, or p-type GaN; and combinations thereof.

The second charge transfer layer 260 may include a single layer. For example, the HIL 262 may be omitted, and the second charge transfer layer 260 may include only the HTL 264 and may be formed by doping a hole injection material (for example, PEDOT:PSS) into the above-described hole transport organic material. Each of the HIL 262 and the HTL 264 may have a thickness of about 10 nm to about 200 nm, preferably, a thickness of about 10 nm to about 100 nm, but the present disclosure is not limited thereto.

Similar to the first exemplary embodiment, the LED 200 according to the second exemplary embodiment of the present disclosure may include at least one exciton blocking layer disposed adjacent to the EML 250. For example, the LED 200 may further include an electron blocking layer disposed between the EML 250 and the HTL 264 and configured to control and prevent the movement of electrons; and/or a hole blocking layer disposed between the ETL 244 and the EML 250 and configured to control and prevent the movement of holes.

In an exemplary embodiment, the ETL 244 constituting the first charge transfer layer 240 disposed between the first electrode 210 and the EML 250 includes the inorganic particles 272 and 274 having different average particle sizes and appropriately adjusts a LUMO energy level of the ETL 244 with respect to the first electrode 210 and the EML 250. That is, as shown in FIG. 5, since the ETL 244 includes the second inorganic particles 274 having a deep LUMO energy level, there is no LUMO energy barrier between the first electrode 210 and the ETL 244. Meanwhile, since the ETL 244 includes the first inorganic particles 272 having a relatively high LUMO energy level, electrons injected into the ETL 244 may gradually have an energy level as high as the high LUMO energy level of the first inorganic particles 272 included in the identical ETL 244. That is, since the electrons injected into the ETL 244 are finally transferred and injected into the EML 250 from the LUMO energy level of the first inorganic particles 272, the number of effective electrons injected into the EML 250 is not reduced, and thus, current leakage is prevented to improve luminous efficiency of LED 200.

In addition, the ETL 244 includes the inorganic particles 272 and 274 having a sufficiently deep HOMO energy level in comparison to a light-emitting material constituting the EML 250. Accordingly, a difference $\Delta G'_H$ between a HOMO energy level of the EML 250 and a HOMO energy level of the ETL 244 is increased, an energy barrier, by which holes are not transported to the ETL 244 from the EML 250, may be generated, thereby preventing holes injected into the EML 250 from being leaked into the ETL 244. As described above, according to the present disclosure, the ETL 244 may include the inorganic particles 272 and 274 having different particle sizes together, thereby improving emission properties such as luminous efficiency and quantum efficiency of the LED 200.

Figure 6:
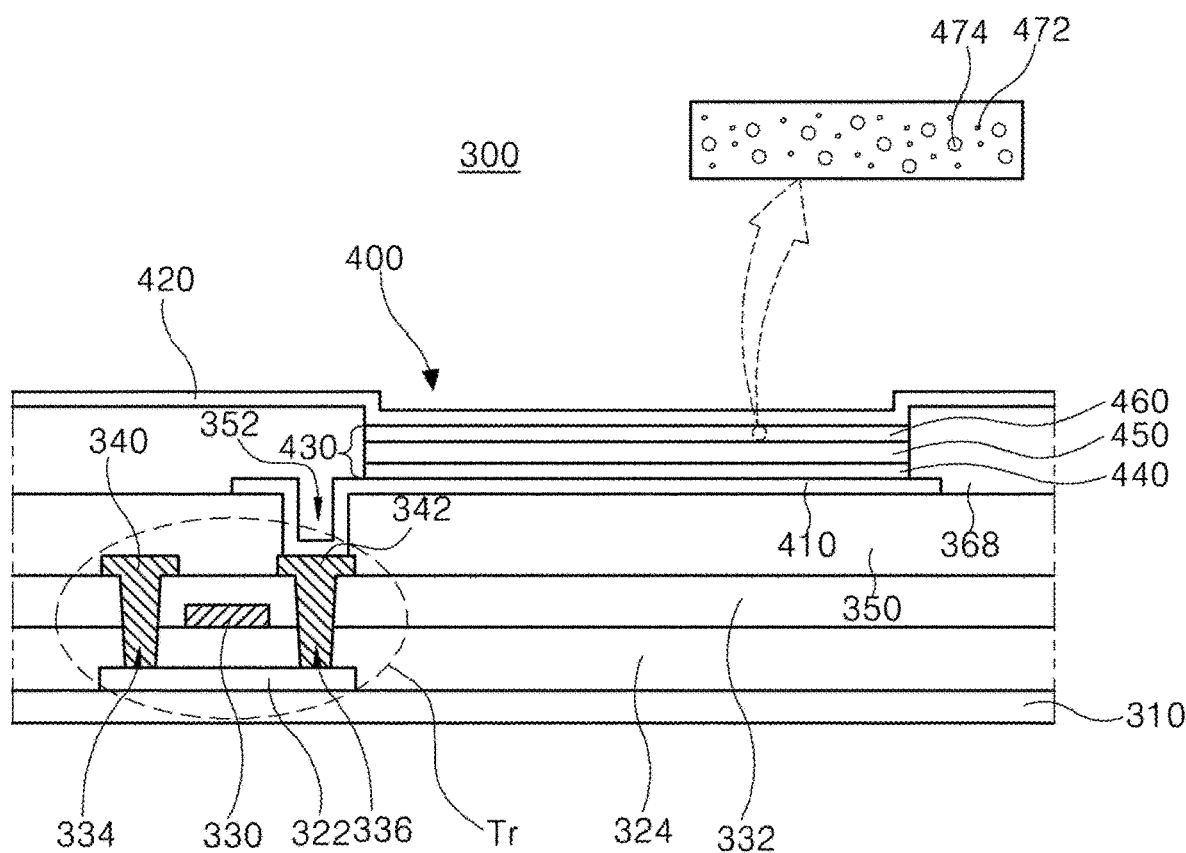
FIG. 6 is a schematic cross-sectional view schematically illustrating an LED display device as an example of a light-emitting device to which an LED according to an exemplary embodiment of the present disclosure is applied.
Figure 7:
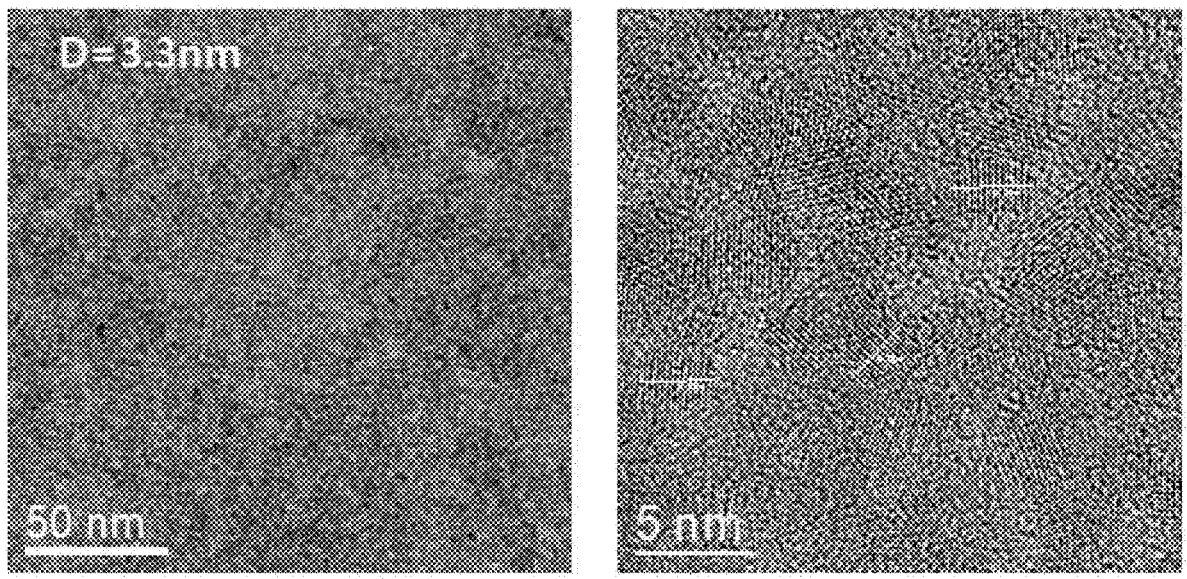
FIGS. 7 to 10 are transmission electron microscope (TEM) images of inorganic particles synthesized according to exemplary embodiments of the present disclosure.
Figure 8:
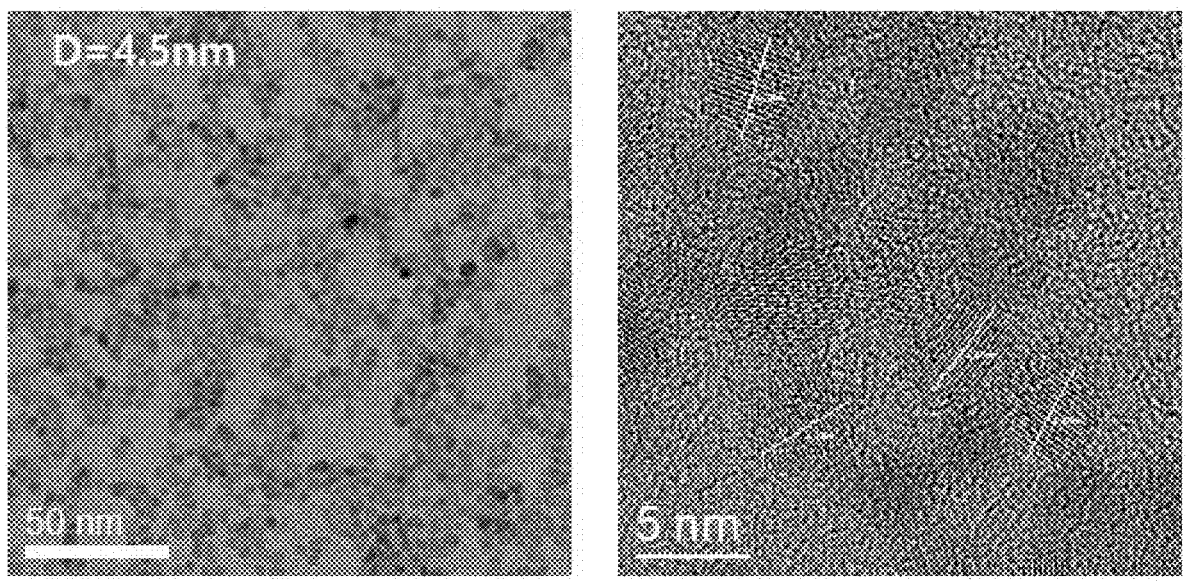
Figure 9:
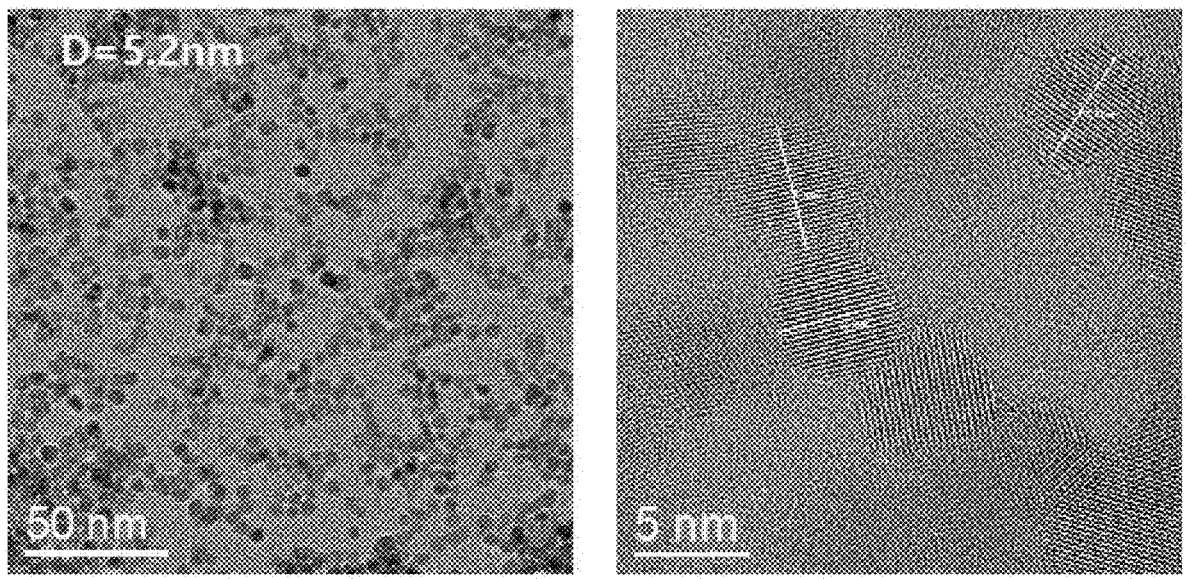
Figure 10:
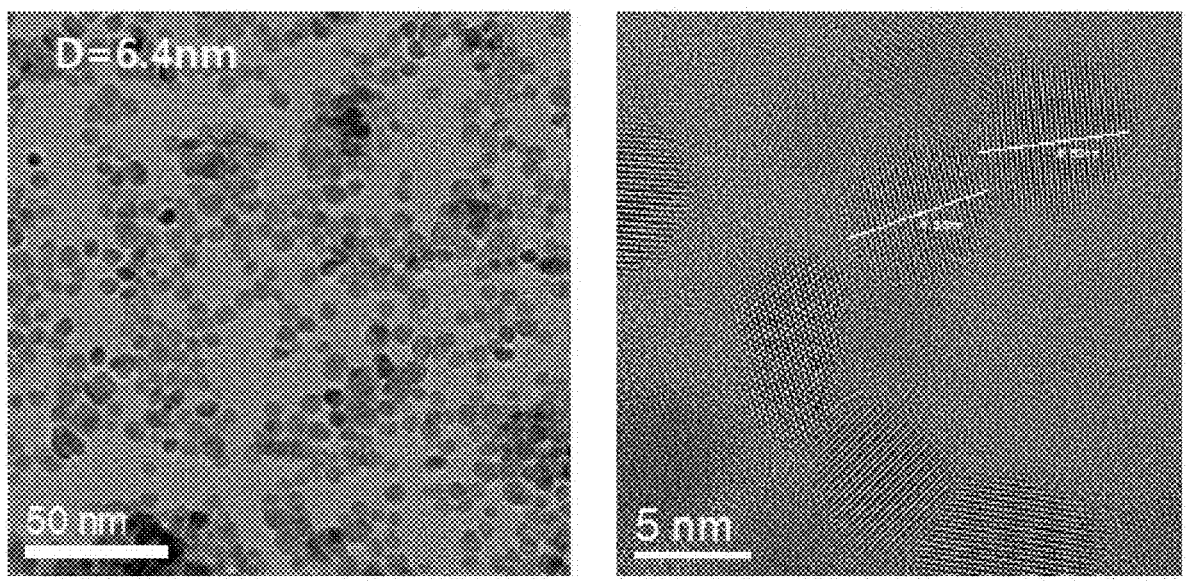

Therefore, an LED including two types of inorganic particles having different average particle sizes according to the present disclosure may be applied to a light-emitting device such as a lighting device or a display device. In an example, a light-emitting device including an LED in which two types of inorganic particles having different average particle sizes according to the present disclosure are used in an ETL will be described. FIG. 6 is a schematic cross-sectional view illustrating a light-emitting display device 300 according to an exemplary embodiment of the present disclosure.

As shown in FIG. 6, the light-emitting display device 300 includes a substrate 310, a driving thin film transistor Tr, that is, a driving element disposed on the substrate 310, and an LED 400 connected to the driving thin film transistor Tr.

A semiconductor layer 322 made of an oxide semiconductor material or polycrystalline silicon is formed on the substrate 310. When the semiconductor layer 322 is made of an oxide semiconductor material, a light shielding pattern (not shown) may be formed on a lower portion of the semiconductor layer 322. The light shielding pattern prevents light from being incident on the semiconductor layer 322 and thus prevents the semiconductor layer 322 from being degraded by light. Alternatively, the semiconductor layer 322 may be made of polycrystalline silicon. In this case, impurities may be doped into both edges of the semiconductor layer 322.

A gate insulating film 324 made of an insulating material is formed on an upper portion of the semiconductor layer 322. The gate insulating film 324 may be made of an inorganic insulating material such as silicon oxide ($SiO_2$) or silicon nitride ($SiN_x$). A gate electrode 330 made of a conductive material such as a metal is formed on an upper portion of the gate insulating film 324 so as to correspond to a center of the semiconductor layer 322.

An interlayer insulating film 332 made of an insulating material is formed on an upper portion of the gate electrode 330. The interlayer insulating film 332 may be made of an inorganic insulating material such as silicon oxide ($SiO_2$) or silicon nitride ($SiN_x$), or may be made of an organic insulating material such as benzocyclobutene or photo-acryl.

The interlayer insulating film 332 has first and second semiconductor layer contact holes 334 and 336 configured to expose both sides of the semiconductor layer 322. The first and second semiconductor layer contact holes 334 and 336 are spaced apart from the gate electrode 330 at both sides of the gate electrode 330. A source electrode 340 and a drain electrode 342 made of a conductive material such as a metal are formed on the interlayer insulating film 332.

The source electrode 340 and the drain electrode 342 are spaced apart with respect to the center of the gate electrode 330 and are in contact with both sides of the semiconductor layer 322 through the first and second semiconductor layer contact holes 334 and 336, respectively.

The semiconductor layer 322, the gate electrode 330, the source electrode 340, and the drain electrode 342 constitute the driving element, i.e., the driving thin film transistor Tr.

In FIG. 6, the driving thin film transistor Tr has a coplanar structure in which the gate electrode 330, the source electrode 340, and the drain electrode 342 are disposed on the upper portion of the semiconductor layer 322. Alternatively, the driving thin film transistor Tr may have an inverted staggered structure in which a gate electrode is disposed on a lower portion of a semiconductor layer and a source electrode and a drain electrode are disposed on an upper portion of the semiconductor layer. In this case, the semiconductor layer may be made of amorphous silicon.

Although not shown, a gate line and a data line cross each other to define a pixel region, and a switching element connected to the gate line and the data line is further formed. The switching element is connected to the driving element, i.e., the driving thin film transistor Tr. In addition, a power line is formed to be spaced apart from and parallel to the gate line or the data line, and a storage capacitor is further formed to constantly maintain a voltage of the gate electrode of the driving element, i.e., the driving thin film transistor Tr during one frame.

Meanwhile, a passivation layer 350 is formed to cover the driving thin film transistor Tr and has a drain contact hole 352 configured to expose the drain electrode 342 of the driving thin film transistor Tr.

A first electrode 410 connected to the drain electrode 342 of the driving thin film transistor Tr through the drain contact hole 352 is formed on the passivation layer 350 so as to be formed separately for each pixel region. The first electrode 410 may be an anode or a cathode and may be made of a conductive material having a relatively large work function value. For example, the first electrode 410 may be made of a doped or undoped metal oxide such as ITO, IZO, ITZO, ICO, $SnO_2$, $In_2O_3$, Cd:ZnO, $F:SnO_2$, $In:SnO_2$, $Ga:SnO_2$, or AZO, or may be made of a material including nickel (Ni), platinum (Pt), gold (Au), silver (Ag), iridium (Ir), or a carbon nanotube in addition to the above-described metal oxides.

Meanwhile, when the light-emitting display device 300 of the present disclosure is a top-emission type, a reflective electrode or a reflective layer may be further formed on a lower portion of the first electrode 410. For example, the reflective electrode or the reflective layer may be made of an aluminum-palladium-copper (APC) alloy.

In addition, a bank layer 368 covering an edge of the first electrode 410 is formed on the passivation layer 350. The bank layer 368 exposes a center of the first electrode 410 which corresponds to a pixel region.

An emissive layer 430 is formed on the first electrode 410. The emissive layer 430 may include only an EML but may include a plurality of charge transfer layers so as to improve luminous efficiency. In an example, the emissive layer 430 is illustrated in FIG. 6 as including a first charge transfer layer 440, an EML 450, and a second charge transfer layer 460 which are sequentially stacked between the first electrode 410 and a second electrode 420.

For example, the first charge transfer layer 440 may be a hole transfer layer and may include an HIL 142 (see FIG. 2) and an HTL 144 (see FIG. 2), which are made of an inorganic material or an organic material. The EML 450 may be made of inorganic luminescent particles or an organic light-emitting material. Meanwhile, the second charge transfer layer 460 may be an electron transfer layer and may include an EIL 162 (see FIG. 2) and an ETL 164 (see FIG. 2). For example, the ETL 164 constituting the second charge transfer layer 460 includes first inorganic particles 472 and second inorganic particles 474 having different average particles sizes. The first and second inorganic particles 472 and 474 may include doped or undoped metal and/or non-metal oxide particles, semiconductor particles, and/or nitrides.

The second electrode 420 is formed on the upper portion of the substrate 310, on which the emissive layer 430 is formed. The second electrode 420 may be disposed on an entire surface of a display region, may be made of a conductive material having a relatively small work function value, and may be a cathode or an anode. For example, the second electrode 420 may be made of at least one selected from Ca, Ba, Ca/Al, LiF/Ca, LiF/Al, $BaF_2$/Al, CsF/Al, $CaCO_3$/Al, $BaF_2$/Ca/Al, Al, Mg, Au:Mg, and Ag:Mg.

FIG. 6 exemplarily shows the LED 400 having a normal structure in which the first charge transfer layer 440 is disposed as a hole transfer layer between the first electrode 410 and the EML 450 and the second charge transfer layer 460 is disposed as an electron transfer layer between the second electrode 420 and the EML 450.

In another embodiment, an LED may be manufactured to have an inverted structure in which the first charge transfer layer 440 is disposed as an electron transfer layer between the first electrode 410 and the EML 450 and the second charge transfer layer 460 is disposed as a hole transfer layer between the second electrode 420 and the EML 450. In this case, the first inorganic particles 472 and second inorganic particles 474 having different average particles sizes are mixed into an ETL constituting the first charge transfer layer 440 disposed between the first electrode 410 and the EML 450.

Two types of the first inorganic particles 472 and second inorganic particles 474 having different average particles sizes are used together in an ETL (not shown) constituting the second charge transfer layer 460 disposed between the EML 450 and the second electrode 420. Since the ETL includes the second inorganic particles 474 having a deep LUMO energy level, electrons generated in the second electrode 420 may be rapidly injected into the ETL having no energy barrier.

In addition, since the ETL includes the first inorganic particles 472 having a high LUMO energy level, the electrons injected into the ETL have the high LUMO energy level of the first inorganic particles 472. Since the electrons injected into the ETL are finally transferred and injected into the EML 450 at the high LUMO energy level of the first inorganic particles 472, the number of effective electrons injected into the EML 450 is not reduced, and thus, current leakage is prevented. Accordingly, electrons may be rapidly transferred and injected into the EML 450.

In addition, as a HOMO energy level of the ETL is much deeper than a HOMO energy level of the EML 450 (i.e., as a difference between the HOMO energy level of the ETL and the HOMO energy level of the EML 450 is increased to $\Delta G'_H$ (see FIG. 3)), holes do not leak from the EML 450 to the ETL. Therefore, luminous efficiency and quantum efficiency of the LED 400 and the light-emitting device 300 including the same are improved.

Hereinafter, the present disclosure will be described through exemplary embodiments, but is not limited to the technical idea described in the following embodiments.

Synthesis Example 1: Synthesis of ZnO Nanoparticle Dispersion

A 0.1 M solution was prepared by dissolving zinc acetate dihydrate in dimethyl sulfoxide (DMSO). A 0.5 M solution was prepared by dissolving tetramethylammonium hydroxide pentahydrate (TMAH) in ethanol. 30 mL of the prepared zinc acetate dihydrate solution and 10 mL of the prepared TMAH solution were introduced into a 250-mL 2-neck reaction flask and were stirred for 1 hour. After the reaction was completed, generated ZnO particles were precipitated using ethyl acetate, and then, a solvent was removed using a centrifuge. After the ZnO particles were redispersed in ethanol, a dispersion stabilizer, i.e., 2-ethanolamine was introduced, and then, the resultant mixture was stirred for 30 minutes. A ZnO dispersion having improved purity was synthesized by performing reprecipitation and redispersion 2 to 4 times by using ethyl acetate and ethanol. Hereinafter, ZnO nanoparticles synthesized in the present Synthesis Example will be referred to as ZnO-A.

Synthesis Example 2: Synthesis of ZnO Nanoparticle Dispersion

In comparison with Synthesis Example 1, the procedure of Synthesis Example 1 was repeated except that a mixture of a zinc acetate dihydrate solution and a TMAH solution was stirred for 16 hours. Hereinafter, ZnO nanoparticles synthesized in the present Synthesis Example will be referred to as ZnO—B.

Synthesis Example 3: Synthesis of ZnO Nanoparticle Dispersion

In comparison with Synthesis Example 1, the procedure of Synthesis Example 1 was repeated except that a mixture of a zinc acetate dihydrate solution and a TMAH solution was stirred for 48 hours. Hereinafter, ZnO nanoparticles synthesized in the present Synthesis Example will be referred to as ZnO—C.

Synthesis Example 4: Synthesis of ZnO Nanoparticle Dispersion

In comparison with Synthesis Example 1, the procedure of Synthesis Example 1 was repeated except that a mixture of a zinc acetate dihydrate solution and a TMAH solution was stirred at a temperature of 60° C. for 48 hours. Hereinafter, ZnO nanoparticles synthesized in the present Synthesis Example will be referred to as ZnO-D.

Experimental Example 1: Evaluation of Physical Properties of ZnO Particles

Figure 11:
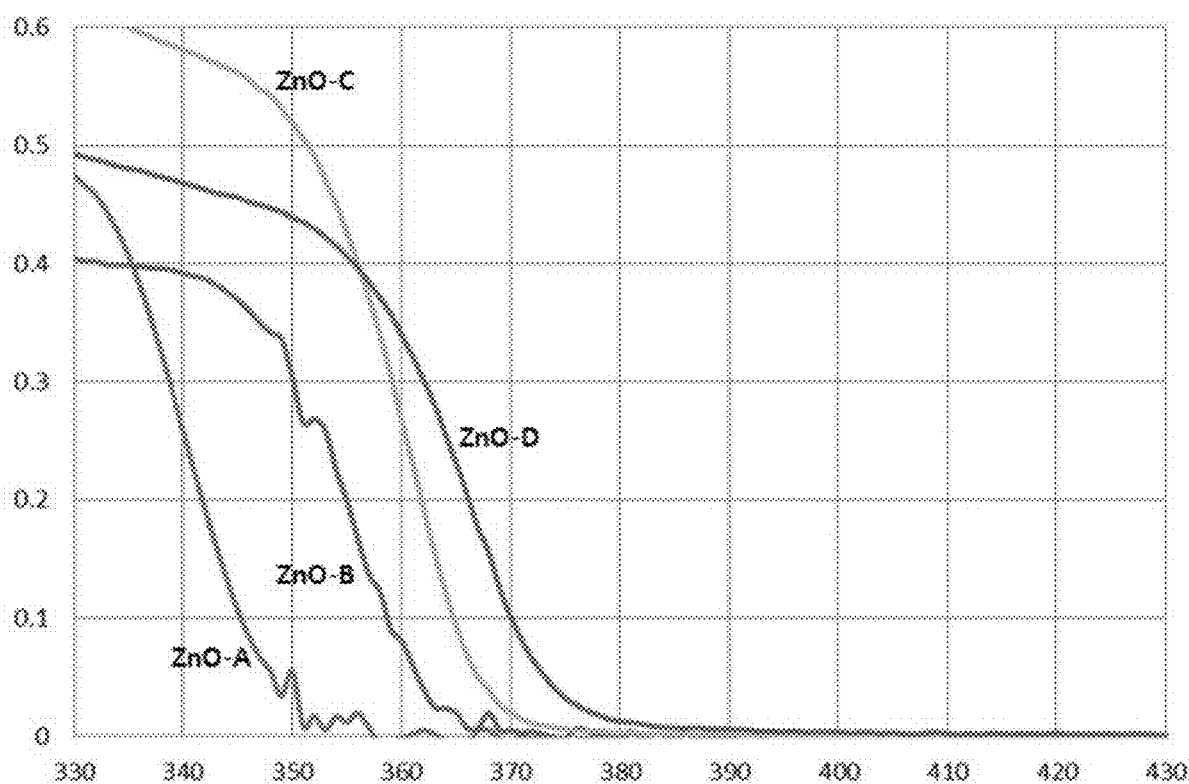
FIG. 11 is a graph showing results of measuring an absorption wavelength of inorganic particles synthesized according to exemplary embodiments of the present disclosure by using a UV-vis spectrometer.

Physical properties of the ZnO-A nanoparticles, the ZnO—B nanoparticles, the ZnO—C nanoparticles, and the ZnO-D particles prepared in Synthesis Examples 1 to 4 were evaluated. FIGS. 7 to 10 are transmission electron microscope (TEM) images of inorganic nanoparticles synthesized according to exemplary embodiments of the present disclosure, and FIG. 11 is a graph showing results of measuring an absorption wavelength of inorganic particles synthesized according to exemplary embodiments of the present disclosure by using a UV-vis spectrometer. Meanwhile, Table 1 shows measurement results of physical properties of ZnO particles measured according to the present Experimental Example.

As shown in FIGS. 7 to 11 and Table 1, as a ZnO particle size is increased, an absorption edge wavelength ($W_{edge}$), at which a light absorption ratio abruptly drops, is shifted to a longer wavelength. The absorption edge wavelength ($W_{edge}$) means minimum energy required to cause a transition from a valence band to a conduction band. As a ZnO particle size is increased, a bandgap energy (Eg) is reduced. Considering that there is no significant difference between valence band energy levels, i.e., HOMO energy levels according to particles size in inorganic nanoparticles, it is considered that a conduction band energy level, i.e., a LUMO energy level is reduced as a ZnO particle size is increased.

TABLE 1

Physical properties of ZnO nanoparticles

| Particles | $W_{edge}$ (nm) | Eg (eV) | Size (TEM, nm) | Relative size |
|---|---|---|---|---|
| ZnO-A | 348 | 3.57 | 3.3 | 51.6% |
| ZnO-B | 356 | 3.49 | 4.5 | 70.3% |
| ZnO-C | 367 | 3.38 | 5.2 | 81.3% |
| ZnO-D | 374 | 3.32 | 6.4 | 100% |

Example 1: Manufacture of LED

ITO glass was patterned and cleaned so as to have an emission area of 3 mm×3 mm. Next, a emissive layer and a cathode were stacked in the following sequence: PEDOT:PSS was spin-coated at 7,000 rpm and then was dried at a temperature of 150° C. for 30 minutes to form an HIL having a thickness of 20 nm to 40 nm; TFB (8 mg/mL in toluene) was spin-coated at 4,000 rpm and then was dried at a temperature of 170° C. for 30 minutes to form an HTL having a thickness of 10 nm to 30 nm; InP/ZnSe/ZnS was spin-coated at 2,000 rpm and then was dried at a temperature of 80° C. for 1 hour to form an EML having a thickness of 10 nm to 30 nm; ZnO-A:ZnO-D at a weight ratio of 1:1 (25 mg/mL in ethanol) was spin-coated at 4,000 rpm and then was dried at a temperature of 80° C. for 30 minutes to form an ETL having a thickness of 30 nm to 50 nm; and Al was deposited on a substrate on which the emissive layer was formed, at a pressure of $1 \times 10^{-6}$ Torr in a vacuum chamber to form a cathode having a thickness of 80 nm.

After the deposition, the substrate was transferred from a deposition chamber to a dry box in order to form a film, and subsequently, encapsulation was performed using UV-curable epoxy and a water getter. An LED has an emission region having an area of 9 mm².

Example 2: Manufacture of LED

An LED was manufactured by repeating the procedure of Example 1 except that ZnO—B prepared according to Synthesis Example 2 and ZnO-D prepared according to Synthesis Example 4 were used together at a weight ratio of 1:1.

Example 3: Manufacture of LED

An LED was manufactured by repeating the procedure of Example 1 except that ZnO—C prepared according to Synthesis Example 3 and ZnO-D prepared according to Synthesis Example 4 were used together at a weight ratio of 1:1.

Example 4: Manufacture of LED

An LED was manufactured by repeating the procedure of Example 1 except that ZnO-A prepared according to Synthesis Example 1 and ZnO-D prepared according to Synthesis Example 4 were used together at a weight ratio of 2:1.

Example 5: Manufacture of LED

An LED was manufactured by repeating the procedure of Example 1 except that ZnO-A prepared according to Synthesis Example 1 and ZnO-D prepared according to Synthesis Example 4 were used together at a weight ratio of 1:2.

Example 6: Manufacture of LED

An LED was manufactured by repeating the procedure of Example 1 except that ZnO-A prepared according to Synthesis Example 1 and ZnO-D prepared according to Synthesis Example 4 were used together at a weight ratio of 4:1.

Example 7: Manufacture of LED

An LED was manufactured by repeating the procedure of Example 1 except that ZnO-A prepared according to Synthesis Example 1 and ZnO-D prepared according to Synthesis Example 4 were used together at a weight ratio of 3:1.

Example 8: Manufacture of LED

An LED was manufactured by repeating the procedure of Example 1 except that ZnO-A prepared according to Synthesis Example 1 and ZnO-D prepared according to Synthesis Example 4 were used together at a weight ratio of 1:3.

Example 9: Manufacture of LED

An LED was manufactured by repeating the procedure of Example 1 except that ZnO-A prepared according to Synthesis Example 1 and ZnO-D prepared according to Synthesis Example 4 were used together at a weight ratio of 1:4.

Comparative Example 1: Manufacture of LED

An LED was manufactured by repeating the procedure of Example 1 except that ZnO-A prepared according to Synthesis Example 1 was used alone in an ETL.

Comparative Example 2: Manufacture of LED

An LED was manufactured by repeating the procedure of Example 1 except that ZnO—B prepared according to Synthesis Example 2 was used alone in an ETL.

Comparative Example 3: Manufacture of LED

An LED was manufactured by repeating the procedure of Example 1 except that ZnO—C prepared according to Synthesis Example 3 was used alone in an ETL.

Comparative Example 4: Manufacture of LED

An LED was manufactured by repeating the procedure of Example 1 except that ZnO-D prepared according to Synthesis Example 4 was used alone in an ETL.

Experimental Example 2: Evaluation of Physical Properties of LED

The LEDs manufactured in Examples 1 to 9 and Comparative Examples 1 to 4 were connected to an external power supply, and EL properties of all devices manufactured in the present disclosure were evaluated at room temperature by using a constant current source (KEITHLEY) and a photometer PR 650. Specifically, a driving voltage (V), current efficiency (Cd/A), power efficiency (Lm/W), external quantum efficiency (EQE), and color coordinates with respect to an emission wavelength of the LED manufactured in each of Examples 1 to 9 and Comparative Examples 1 to 4 were measured. Measurement results were shown in Table 2.

TABLE 3

| | 10 mA/cm$^2$ | | | | |
|---|---|---|---|---|---|
| Sample(ETL) | Cd/A | Lm/W | EQE (%) | CIEx | CIEy |
| Example 1 ZnO-A:ZnO-D(1:1) | 1.47 | 1.38 | 2.34 | 0.687 | 0.312 |
| Example 2 ZnO-B:ZnO-D(1:1) | 0.86 | 0.80 | 1.46 | 0.689 | 0.310 |
| Example 3 ZnO-C:ZnO-D(1:1) | 0.67 | 0.70 | 1.01 | 0.684 | 0.314 |
| Example 4 ZnO-A:ZnO-D(2:1) | 1.59 | 1.48 | 2.45 | 0.686 | 0.313 |
| Example 5 ZnO-A:ZnO-D(1:2) | 0.62 | 0.60 | 1.00 | 0.686 | 0.312 |
| Example 6 ZnO-A:ZnO-D(4:1) | 0.79 | 0.76 | 1.35 | 0.689 | 0.311 |
| Example 7 ZnO-A:ZnO-D(3:1) | 1.36 | 1.31 | 2.35 | 0.689 | 0.310 |
| Example 8 ZnO-A:ZnO-D(1:3) | 0.67 | 0.69 | 1.17 | 0.689 | 0.310 |
| Example 9 ZnO-A:ZnO-D(1:4) | 0.44 | 0.41 | 0.75 | 0.688 | 0.311 |
| Comparative Example 1 ZnO-A only | 0.57 | 0.57 | 0.92 | 0.686 | 0.313 |
| Comparative Example 2 ZnO-B only | 0.59 | 0.63 | 0.89 | 0.684 | 0.314 |

TABLE 3-continued

| | 10 mA/cm$^2$ | | | | |
|---|---|---|---|---|---|
| Sample(ETL) | Cd/A | Lm/W | EQE (%) | CIEx | CIEy |
| Comparative Example 3 ZnO-C only | 0.52 | 0.56 | 0.83 | 0.685 | 0.313 |
| Comparative Example 4 ZnO-D only | 0.38 | 0.42 | 0.57 | 0.684 | 0.314 |

As shown in Table 2, in a case in which ZnO particles having different average particles sizes are used together in an ETL, current efficiency, luminous efficiency such as power efficiency, and external quantum efficiency are improved when compared to a case in which ZnO particles having the same average particle size are used alone in an ETL.

Specifically, in a case in which ZnO-A particles and ZnO-D particles are used together, for example, at a weight ratio of 2:1 (Example 4), current efficiency, power efficiency, and external quantum efficiency are respectively increased by up to 179%, up to 160%, and up to 166% in comparison to a case in which ZnO-A particles are used alone, and are respectively increased by up to 318%, up to 252%, and up to 330% in comparison to a case in which ZnO-D particles are used alone.

In addition, in a case in which ZnO—B particles and ZnO-D particles are used together, current efficiency, power efficiency, and external quantum efficiency are respectively increased by 46%, 27%, and 64% in comparison to a case in which ZnO—B particles are used alone, and are respectively increased by 126%, 90%, and 156% in comparison to a case in which ZnO-D particles are used alone.

In addition, in a case in which ZnO—C particles and ZnO-D particles are used together, current efficiency, power efficiency, and external quantum efficiency are respectively increased by 29%, 25%, and 22% in comparison to a case in which ZnO—C particles are used alone, and are respectively increased by 76%, 67%, and 77% in comparison to a case in which ZnO-D particles are used alone.

Therefore, according to the present disclosure, when inorganic particles having different average particle sizes are used together in an ETL, it can be confirmed that it is possible to realize an LED having considerably improved luminous efficiency and quantum efficiency and to apply the LED to a light-emitting device.

According to the present disclosure, the present disclosure proposes an LED including an electron transfer layer made of two or more types of inorganic particles having different sizes, and a light-emitting device including the LED. The organic particles having different sizes can be used in the electron transfer layer, thereby preventing holes from being leaked from an EML.

In addition, electrons can be rapidly injected into the EML in a balanced manner by removing an energy barrier related to electron injection and suppressing current leakage. Therefore, it is possible to realize and manufacture an LED having considerably improved emission properties such as luminous efficiency and quantum efficiency, and a light-emitting device.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present invention cover the modifications and variations of the present disclosure provided they come within the scope of the appended claims and their equivalents.

What is claimed is:

1. A light emitting diode comprising:
a first electrode and a second electrode facing the first electrode;
an emitting material layer (EML) disposed between the first electrode and the second electrode; and
an electron transport layer (ETL) adjacent to the EML, the ETL including:
a plurality of first inorganic particles having a first average particle size in a range from 3.0 nm to 5.5 nm, and
a plurality of second inorganic particles having a second average particle size greater than the first average particle size, the second average particle size in a range from 6.0 nm to 7.0 nm.

2. The light emitting diode of claim 1, wherein the plurality of first inorganic particles and the plurality of second inorganic particles are metal and/or non-metal oxide particles.

3. The light emitting diode of claim 2, wherein the plurality of first inorganic particles and the plurality of second inorganic particles each include at least one of titanium dioxide ($TiO_2$), zinc oxide (ZnO), zinc magnesium oxide ($ZnMgO_2$), zirconium oxide ($ZrO_2$), tin oxide ($SnO_2$), tungsten oxide ($WO_3$), tantalum oxide ($Ta_2O_3$), hafnium oxide ($HfO_3$), aluminum oxide ($Al_2O_3$), zirconium silicon oxide ($ZrSiO_4$), barium titanium oxide ($BaTiO_3$), and barium zirconium oxide ($BaZrO_3$).

4. The light emitting diode of claim 1, wherein the plurality of first inorganic particles have a first energy bandgap, and the plurality of second inorganic particles have a second energy bandgap smaller than the first energy bandgap.

5. The light emitting diode of claim 1, wherein the first average particle size is in a range from 50% to 85% of the second average particle size.

6. The light emitting diode of claim 1, wherein the plurality of first inorganic particles and the plurality of second inorganic particles comprise zinc oxide (ZnO).

7. The light emitting diode of claim 1, wherein a weight ratio of the plurality of first inorganic particles and the plurality of second inorganic particles is in a range from 1:4 to 4:1.

8. The light emitting diode of claim 1, wherein the EML is disposed on the first electrode, the ETL is disposed on the EML, and the second electrode is disposed on the ETL.

9. The light emitting diode of claim 1, wherein the ETL is disposed on the first electrode, the EML is disposed on the ETL, and the second electrode is disposed on the EML.

10. A light-emitting device comprising:
a substrate; and
the light emitting diode of claim 1 on the substrate.

11. The light-emitting device of claim 10, wherein the light-emitting device comprises a light-emitting display device.

12. A light emitting diode comprising:
a first electrode and a second electrode facing the first electrode;
an emitting material layer (EML) disposed between the first electrode and the second electrode; and
an electron transport layer (ETL) adjacent to the EML, the ETL including:
a plurality of first inorganic particles having a first energy bandgap, the plurality of first inorganic particles having a first average particle size in a range from 3.0 nm to 5.5 nm, and
a plurality of second inorganic particles having a second energy bandgap smaller than the first energy bandgap, the plurality of second inorganic particles having a second average particle size in a range from 6.0 nm to 7.0 nm.

13. The light emitting diode of claim 12, wherein the plurality of first inorganic particles have a first lowest unoccupied molecular orbital (LUMO) energy level, and the plurality of second inorganic particles have a second LUMO energy level lower than the first LUMO energy level.

14. The light emitting diode of claim 12, wherein the plurality of first inorganic particles have a first highest occupied molecular orbital (HOMO) energy level, and the plurality of second inorganic particles have a second HOMO energy level, and wherein the first HOMO energy level and the second HOMO energy level are lower than a HOMO energy level of the EML.

15. The light emitting diode of claim 12, wherein a lowest unoccupied molecular orbital (LUMO) energy level of the plurality of first inorganic particles is higher than a LUMO energy level of the EML.

16. The light emitting diode of claim 12, wherein a highest occupied molecular orbital (HOMO) energy level of the plurality of first inorganic particles and the HOMO energy level of the plurality of second inorganic particles is lower than a HOMO energy level of an oxadiazole-based, triazole-based, benzoxazole-based, benzothiazole-based, benzimidazole-based, or triazine-based organic compound.

17. The light emitting diode of claim 12, wherein the plurality of first inorganic particles and the plurality of second inorganic particles are metal and/or non-metal oxide particles.

18. The light emitting diode of claim 12, wherein the plurality of first inorganic particles and the plurality of second inorganic particles each include at least one of titanium dioxide ($TiO_2$), zinc oxide (ZnO), zinc magnesium oxide ($ZnMgO_2$), zirconium oxide ($ZrO_2$), tin oxide ($SnO_2$), tungsten oxide ($WO_3$), tantalum oxide ($Ta_2O_3$), hafnium oxide ($HfO_3$), aluminum oxide ($Al_2O_3$), zirconium silicon oxide ($ZrSiO_4$), barium titanium oxide ($BaTiO_3$), and barium zirconium oxide ($BaZrO_3$).

19. The light emitting diode of claim 12, wherein the EML is disposed on the first electrode, the ETL is disposed on the EML, and the second electrode is disposed on the ETL.

20. The light emitting diode of claim 12, wherein the ETL is disposed on the first electrode, the EML is disposed on the ETL, and the second electrode is disposed on the EML.

* * * * *